(12) United States Patent
Berger et al.

(10) Patent No.: US 12,417,899 B2
(45) Date of Patent: Sep. 16, 2025

(54) INTEGRATED SHOWERHEAD

(71) Applicant: Applied Materials, Inc., Santa Clara, CA (US)

(72) Inventors: Alexander Berger, Palo Alto, CA (US); Ming Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 667 days.

(21) Appl. No.: 17/696,594

(22) Filed: Mar. 16, 2022

(65) Prior Publication Data

US 2023/0298862 A1   Sep. 21, 2023

(51) Int. Cl.

| H01J 37/32 | (2006.01) |
|---|---|
| C23C 16/455 | (2006.01) |
| C23C 16/50 | (2006.01) |
| H05K 1/02 | (2006.01) |
| H05K 1/18 | (2006.01) |

(52) U.S. Cl.
CPC .. H01J 37/32449 (2013.01); C23C 16/45565 (2013.01); C23C 16/45587 (2013.01); C23C 16/50 (2013.01); H05K 1/0272 (2013.01); H05K 1/181 (2013.01); *H05K 2201/09063* (2013.01); *H05K 2201/10083* (2013.01); *H05K 2201/10522* (2013.01); *H05K 2201/10545* (2013.01)

(58) Field of Classification Search
CPC .......... C23C 16/4404; C23C 16/45502; C23C 16/45565; C23C 16/45587; C23C 16/45589; C23C 16/50; C23C 16/52; H01J 37/3244; H01J 37/32449; H01L 21/67017; H05K 1/0272; H05K 1/181; H05K 2201/09063; H05K 2201/10083; H05K 2201/10522; H05K 2201/10545
See application file for complete search history.

(56) References Cited

U.S. PATENT DOCUMENTS

| 5,853,484 A * | 12/1998 | Jeong | C23C 16/44 |
|---|---|---|---|
| | | | 118/712 |
| 6,279,402 B1 | 8/2001 | Fisher | |
| 6,705,345 B1 * | 3/2004 | Bifano | F16K 99/0001 |
| | | | 251/129.01 |
| 10,130,958 B2 | 11/2018 | Tam et al. | |

(Continued)

FOREIGN PATENT DOCUMENTS

| KR | 200489691 Y1 | 7/2019 |
|---|---|---|
| WO | 2019078919 A1 | 4/2019 |

OTHER PUBLICATIONS

International Search Report and Written Opinion dated May 4, 2023 for Application No. PCT/US2023/010578.

*Primary Examiner* — Benjamin Kendall
(74) *Attorney, Agent, or Firm* — Patterson + Sheridan, LLP

(57) ABSTRACT

A showerhead for a processing chamber includes a faceplate with a plurality of openings. A plurality of compartments are recessed into a top surface of the faceplate. The showerhead includes a plurality of MEMS devices. Each MEMS device is disposed in a corresponding compartment of the plurality of compartments. A printed circuit board including a plurality of ports therethrough is coupled to each MEMS device. Each MEMS device is configured to regulate a gas flow into each corresponding compartment through a corresponding port of the plurality of ports in the printed circuit board.

20 Claims, 14 Drawing Sheets

(56) References Cited

U.S. PATENT DOCUMENTS

| | | |
|---|---|---|
| 10,403,476 B2 | 9/2019 | Gregor et al. |
| 10,804,079 B2 | 10/2020 | Gregor et al. |
| 10,934,621 B2 | 3/2021 | Sung et al. |
| 2003/0019580 A1 | 1/2003 | Strang |
| 2004/0040502 A1* | 3/2004 | Basceri ............ C23C 16/45574 118/715 |
| 2004/0040503 A1* | 3/2004 | Basceri ............ C23C 16/45531 118/715 |
| 2013/0012029 A1 | 1/2013 | Vermeer et al. |
| 2020/0365386 A1 | 11/2020 | Benjamin Raj et al. |
| 2021/0096011 A1 | 4/2021 | Smith et al. |

* cited by examiner

INTEGRATED SHOWERHEAD

BACKGROUND

Field

Embodiments of the present disclosure generally relate to apparatus and methods utilized in the manufacture of semiconductor devices. More particularly, embodiments of the present disclosure relate to components, such as a showerhead, of a processing chamber for forming semiconductor devices.

Description of the Related Art

Semiconductor substrates are processed for a wide variety of applications, including the fabrication of integrated devices and microdevices. During processing, the substrate is positioned on a substrate support within a process chamber. The interior of the process chamber is placed under vacuum while the substrate is processed by exposure to process gases. Some processes involve etching material away from the substrate, and other processes involve the deposition of material onto the substrate. The uniformity of the etch or of the material deposited on the substrate may be affected by the distribution of process gases within the process chamber. In some process chambers, a showerhead distributes the process gas. The pattern and sizes of holes in the showerhead may be optimized for the distribution of a certain process gas for a particular processing operation, but may not be optimized for a different process gas or for distributing process gasses in a different processing operation.

Thus, there is a need for improved process chambers that facilitate effective control over process gas distribution.

SUMMARY

The present disclosure generally relates to components, such as a showerhead, of a substrate processing chamber for forming semiconductor devices. In one embodiment, a showerhead for a processing chamber includes a faceplate. The faceplate includes a bottom surface, a top surface, and a plurality of openings extending from the top surface to the bottom surface. A printed circuit board is coupled to the faceplate. The showerhead further includes a plurality of MEMS devices coupled to the printed circuit board, each MEMS device associated with one or more unique openings of the plurality of openings, and configured to regulate a gas flow through the corresponding one or more unique openings. The showerhead further includes a plurality of local controllers coupled to the printed circuit board, each local controller configured to control operation of a corresponding MEMS device of the plurality of MEMS devices independently of an operation of other MEMS devices of the plurality of MEMS devices.

In another embodiment, a showerhead for a processing chamber includes a printed circuit board including a plurality of ports therethrough. The showerhead further includes a faceplate. The faceplate includes a plurality of MEMS modules coupled to the printed circuit board. Each MEMS module includes: a body; sidewalls extending below the body to a base, the base including one or more holes; and a MEMS device operable to control gas flow through at least one of the plurality of ports.

In another embodiment, a processing chamber includes a chamber body and a showerhead disposed in the chamber body. The faceplate includes a bottom surface, a top surface, a plurality of compartments recessed into the top surface, and a plurality of openings extending from each compartment to the bottom surface. The showerhead further includes a plurality of MEMS devices, each MEMS device in a corresponding compartment of the plurality of compartments, and configured to regulate a gas flow into each corresponding compartment. The showerhead further includes a printed circuit board coupled to the top surface of the faceplate and to each MEMS device. The showerhead further includes a controller coupled to the printed circuit board, and configured to control operations of at least one MEMS device of the plurality of MEMS devices independently of operations of other MEMS devices of the plurality of MEMS devices.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

Figure 1:
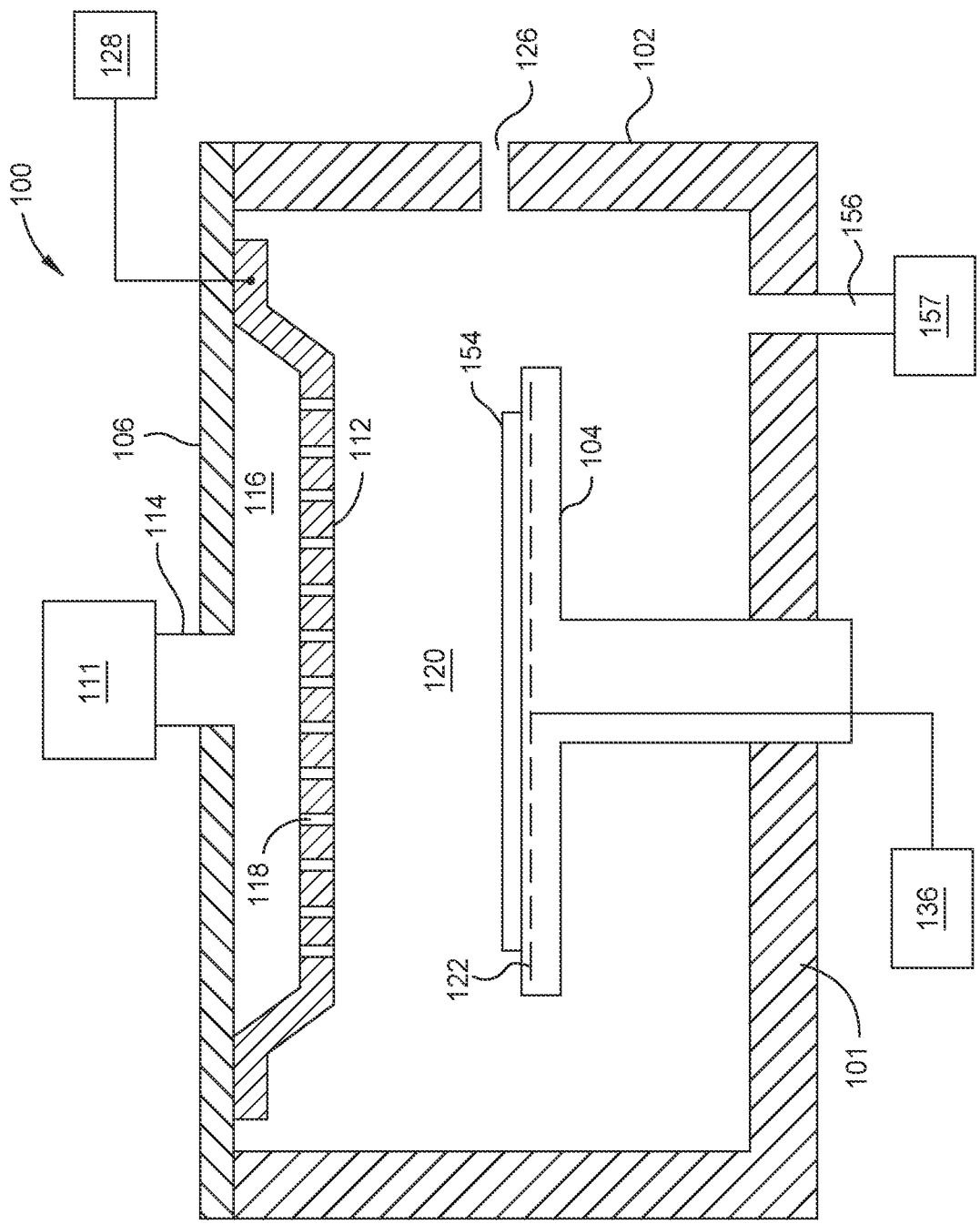
FIG. 1 is a schematic cross-sectional view of a processing chamber.

To facilitate understanding, identical reference numerals have been used, where possible, to designate identical elements that are common to the figures. It is contemplated that elements and features of one embodiment may be beneficially incorporated in one or more other embodiments without further recitation.

DETAILED DESCRIPTION

The present disclosure concerns components, such as a showerhead, of a processing chamber for forming semiconductor devices. Embodiments of the present disclosure provide showerheads that can be readily configured for use with any one or more of a plurality of gases used in the processing of substrates. Example gases include silicon-containing gases, oxygen-containing gases, nitrogen-containing gases, hydrogen-containing gases, argon-containing gases, and metal-containing gases.

FIG. 1 illustrates a schematic cross-sectional view of a processing chamber 100. As illustrated, the processing chamber 100 is configured as a Plasma Enhanced Chemical Vapor Deposition (PECVD) chamber, although in some embodiments, processing chamber 100 may be configured to perform another plasma-enhanced processing operation (such as etching or physical vapor deposition) or a processing operation that does not involve plasma (such as chemical vapor deposition). The processing chamber 100 features a chamber body 102, a substrate support 104 disposed inside the chamber body 102, and a lid 106 coupled to the chamber body 102, and enclosing the substrate support 104 in a processing volume 120. The substrate support 104 is configured to support a substrate 154 thereon during processing. The substrate 154 is provided to the processing volume 120 through an opening 126. While the embodiment of FIG. 1 is directed to a PECVD chamber, the lid 106 and substrate support 104 of FIG. 1 may be used with other processing chambers that utilize plasma generated in the processing volume 120. Additionally, the lid 106 and substrate support 104 of FIG. 1 may be used with other processing chambers that do not utilize plasma generated in the processing volume 120.

As illustrated, a showerhead 112 contains or serves as an electrode, and is coupled to a power source 128 through a match circuit. The power source 128 is a radio frequency (RF) power source that is electrically coupled to the electrode 108. Further, the power source 128 provides between about 100 Watts and about 3,000 Watts at a frequency of about 50 kHz to about 13.6 MHz. In some embodiments, the power source 128 can be pulsed during various operations. The electrode 108 and power source 128 facilitate control of a plasma formed within the processing volume 120.

The substrate support 104 contains, or is formed from, one or more metallic or ceramic materials. Exemplary metallic or ceramic materials include one or more metals, metal oxides, metal nitrides, metal oxynitrides, or any combination thereof. For example, the substrate support 104 may contain or be formed from aluminum, aluminum oxide, aluminum nitride, aluminum oxynitride, or any combination thereof.

As illustrated, an electrode 122 is embedded within the substrate support 104, but alternatively may be coupled to a surface of the substrate support 104. The electrode 122 is coupled to a power source 136. It is contemplated that the power source 136 may be DC power, pulsed DC power, radio frequency (RF) power, pulsed RF power, or any combination thereof. The power source 136 is configured to drive the electrode 122 with a drive signal to generate a plasma within the processing volume 120. It is contemplated that the drive signal may be one of a DC signal and a varying voltage signal (e.g., RF signal). Further, the electrode 122 may alternatively be coupled to the power source 128 instead of the power source 136, and the power source 136 may be omitted.

Plasma is generated in the processing volume 120 via the power source 128 and the power source 136. An RF field is created by driving at least one of the showerhead 112 electrode and the electrode 122 with drive signals to facilitate the formation of a plasma within the processing volume 120. The presence of a plasma facilitates processing of the substrate 154, for example, the deposition of a film onto a surface of the substrate 154 or the etching of material from a surface of the substrate 154.

An exhaust port 156 is coupled to a vacuum pump 157. The vacuum pump 157 removes excess process gases or by-products from the processing volume 120 via the exhaust port 156 during and/or after processing.

A gas supply source 111 includes one or more gas sources. The gas supply source 111 is configured to deliver the one or more gases from the one or more gas sources through the showerhead 112 and into the processing volume 120. Each of the one or more gas sources provides a process gas such as silane, disilane, tetraethyl orthosilicate (TEOS), germane, a metal halide (such as titanium tetrachloride, tantalum pentachloride, tungsten hexafluoride), an organometallic (such as tetrakis(dimethylamido) titanium, pentakis(dimethylamido) tantalum), ammonia, oxygen ($O_2$), hydrogen peroxide, hydrogen, diborane, chlorine ($Cl_2$), sulfur hexafluoride, a hydrocarbon (generically $C_xH_y$), among others. In some embodiments, the process gas may be ionized to form a plasma within the processing volume 120. For example, one or more of a carrier gas and an ionizable process gas are provided into the processing volume 120 to process the substrate 154. When processing a 300 mm substrate, the process gases are introduced to the processing chamber 100 at a flow rate from about 6500 sccm to about 8000 sccm, from about 100 sccm to about 10,000 sccm, or from about 100 sccm to about 1000 sccm. Alternatively, other flow rates may be utilized. In some examples, a remote plasma source can be used to deliver plasma to the processing chamber 100 and can be coupled to the gas supply source 111.

The showerhead 112 features openings 118 for admitting a process gas or gases into the processing volume 120 from the gas supply source 111. The process gases are supplied to the processing chamber 100 via the gas feed 114, and the process gases enter a plenum 116 prior to flowing through the openings 118. In some embodiments, different process gases that are flowed simultaneously during a processing operation enter the processing chamber 100 via separate gas feeds and separate plenums prior to entering the processing volume 120 through the showerhead 112.

Gas flow through the openings 118 of the showerhead 112 is regulated by one or more micro-electro-mechanical systems (MEMS devices) disposed in the showerhead 112. In some embodiments, it is contemplated that gas flow through an individual opening 118 and/or through a cluster of openings 118 may be regulated by a MEMS device. In some embodiments, it is contemplated that gas flow through all openings 118 is regulated by a plurality of MEMS devices. In an example, each MEMS device regulates gas flow through one or more openings 118 such that gas flow through any single opening 118 is regulated by a corresponding MEMS device. It is contemplated that the regulation of gas flow by a MEMS device includes permitting a maximum flow of gas through an individual opening 118 and/or through a cluster of openings 118. It is contemplated that the regulation of gas flow by a MEMS device includes preventing any flow of gas through an individual opening 118 and/or through a cluster of openings 118. It is contemplated that the regulation of gas flow by a MEMS device includes controlling a flow of gas through an individual opening 118 and/or through a cluster of openings 118 such that the flow is greater than zero and less than a maximum flow of gas through the individual opening 118 and/or through the cluster of openings 118.

Figure 2A:
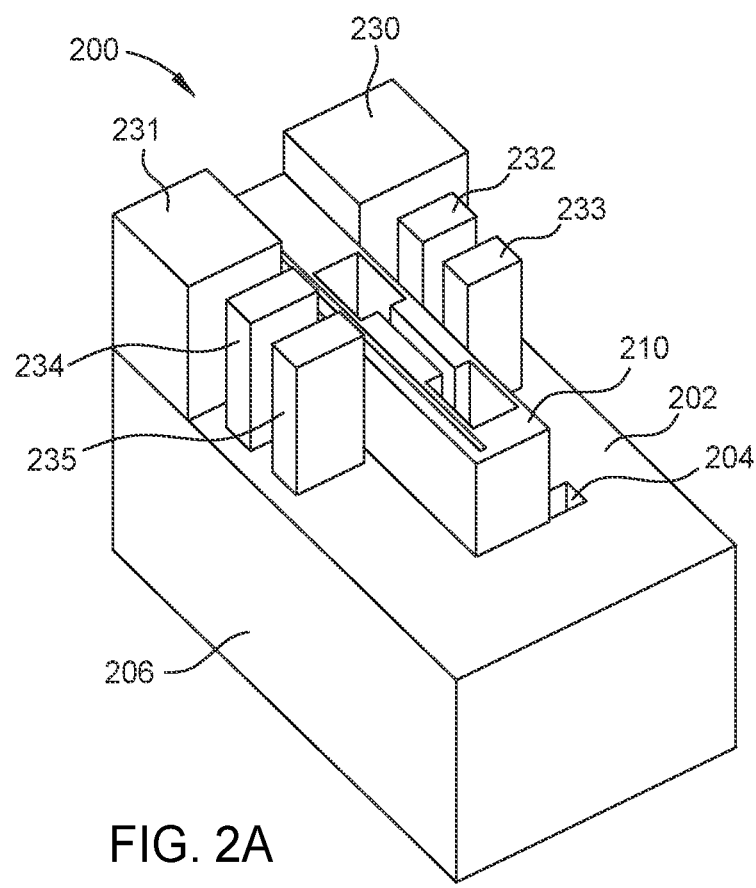
FIG. 2A is an isometric view of the top of an exemplary MEMS device.
Figure 2B:
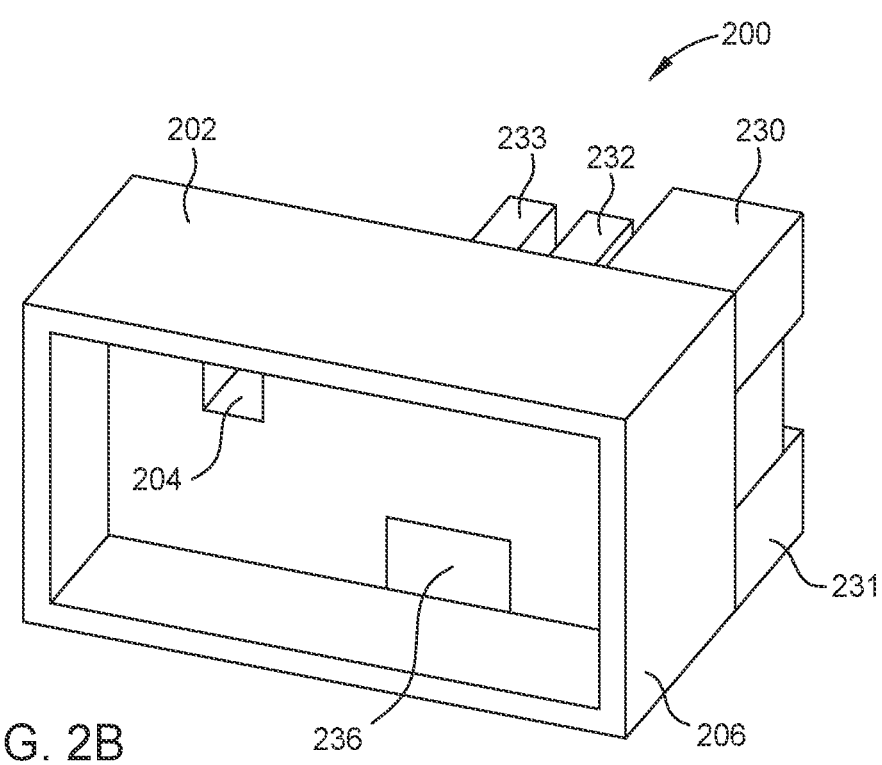
FIG. 2B is an isometric view of the bottom of the MEMS device of FIG. 2A.

FIGS. 2A-2D illustrate an exemplary MEMS device 200. FIG. 2A is an isometric view of the top of the MEMS device 200, and FIG. 2B is an isometric view of the bottom of the MEMS device 200. The MEMS device 200 includes a body 202, having an orifice 204 therethrough. Although illustrated as substantially rectangular, it is contemplated that the orifice 204 may have any appropriate cross-sectional shape, such as circular, elliptical, triangular, and the like. Furthermore, in some embodiments, the orifice 204 may include multiple orifices. Moreover, it is contemplated that one variant of MEMS device 200 may have an orifice 204 that has a cross-sectional size different from the cross-sectional size of the orifice 204 of another variant of MEMS device 200.

A skirt 206 extends from the body 202 at the bottom of the MEMS device 200. A valve member 210 is mounted on the body 202 and regulates fluid flow through the orifice 204. The valve member 210 is electrically conductive. In some embodiments, the valve member 210 is metallic. The valve member 210 passes an electrical current that flows between contacts 230, 231, to which the valve member 210 is connected. As illustrated, in some embodiments, the MEMS device 200 includes contacts 232, 233 that are configured for connection to a heater, such as a wire through which an electrical current is passed in order to induce heating. In some of such embodiments, the heater is integrated with the MEMS device 200. Alternatively, the heater may be a separate component configured to be plugged into the MEMS device 200. In some embodiments, the heater may be omitted.

As illustrated, in some embodiments, the MEMS device 200 includes contacts 234, 235 that are configured for connection to a sensor 236. In some of such embodiments, the sensor 236 is integrated with the MEMS device 200. Alternatively, the sensor 236 may be a separate component configured to be plugged into the MEMS device 200. It is contemplated that the sensor 236 may be configured to measure one or more of pressure, temperature, or flow rate. In an example, measurements of the flow rate of a fluid through the orifice 204 may be derived at least in part from measurements of pressure obtained from the sensor 236. In some embodiments, the sensor 236 may be omitted.

Figure 2C:
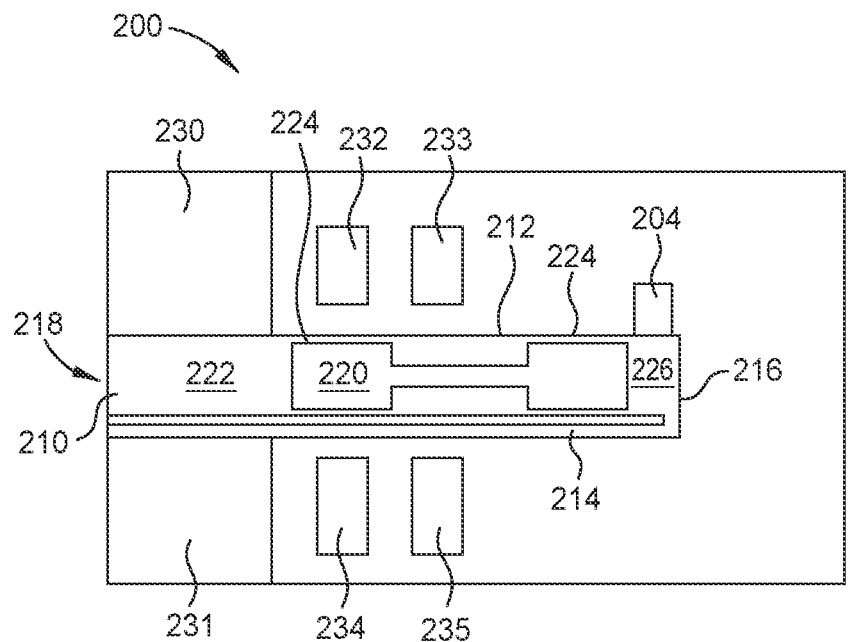
FIGS. 2C and 2D are plan views of the top of the MEMS device of FIG. 2A.

FIG. 2C is a plan view of the top of the MEMS device 200. The valve member 210 of the MEMS device 200 includes a first section 212 and a second section 214. At an end 216 of the valve member 210 near the orifice 204, the first and second sections 212, 214 are connected together. At an opposite end 218 of the valve member 210, the first section 212 is connected to contact 230, and the second section 214 is connected to contact 231, but the first 212 and second 214 sections are not connected together. The first section 212 is nominally thicker than the second section 214, but includes a void 220. The void 220 is illustrated as two connected rectangles, however, it is contemplated that the void 220 may have or include any suitable shape, such as one or more triangles, one or more squares, one or more circles, one or more ellipses, or one or more of any other shape. The void 220 divides the first section into a relatively thick portion 222 and one or more relatively thin portions 224. An end portion 226 of the first section 212 is relatively thick, and is positioned at the end 216 near to the orifice 204. In the configuration illustrated, the orifice 204 is at least partially uncovered by the end portion 226, thereby permitting gas to flow through the orifice 204. The end portion 226 is configured to at least partially obscure the orifice 204 during operation of the MEMS device 200.

Figure 2D:
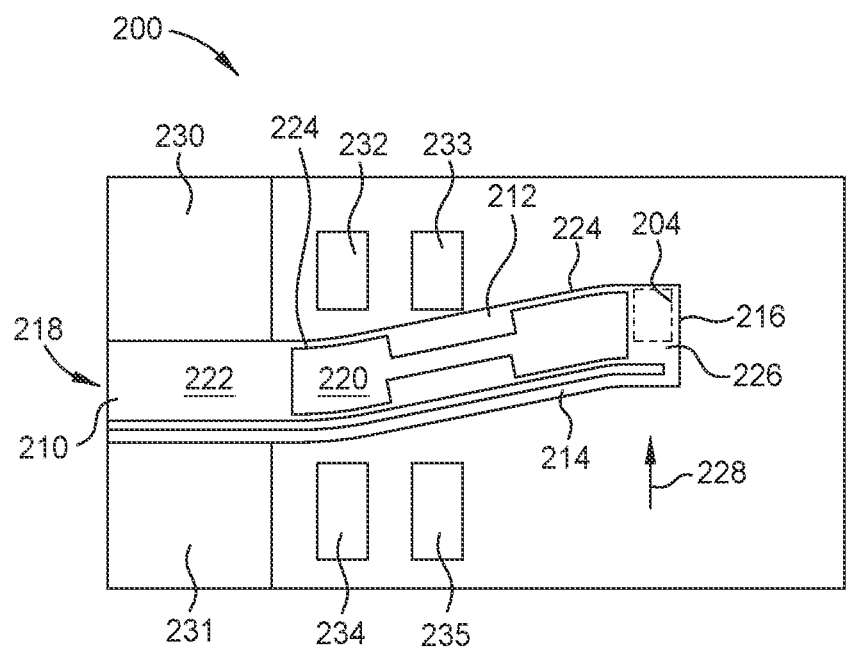

FIG. 2D is a plan view of the top of the MEMS device 200 when an electrical current is passed through the valve member 210. Because the first section 212 and second section 214 are connected together at end 216 but not connected together at end 218, a voltage applied at the contacts 230, 231 causes a current to flow through the first section 212 and through the second section 214. The thicknesses of the first 212 and second 214 sections impact the electrical resistances of the first and second sections 212, 214—the thicker the section, the lower the resistance. When a current flows through the valve member 210, the second section 214 and the relatively thin portions 224 of the first section 212 experience greater heating than the relatively thick portion(s) 222 of the first section 212.

Because of the difference in heating, the relatively thick portion(s) 222 of the first section 212 do not experience as much thermal expansion as do the second section 214 and the relatively thin portions 224 of the first section 212. Thus, the first section 212 does not linearly elongate to the same extent as does the second section 214. Because the first section 212 and the second section 214 are connected together at end 216, elongation of the second section 214 causes the first section 212 to deform into an "S" shape, facilitated by the void 220. The end 216 deflects in the direction of arrow 228, thus causing the end portion 226 of the first section 212 to at least partially obscure the orifice 204. In some embodiments, it is contemplated that the end 216 deflects to such an extent that the end portion 226 completely obscures the orifice 204. In some of such embodiments, the end portion 226 completely blocks passage of gas through the orifice 204.

As illustrated in FIG. 2D, in some embodiments, elongation of the valve member 210 due to heating is compensated by deformation of the first section 212 into the "S" shape. In this way, the orientation of the end portion 226 is maintained during travel, and the end portion 226 can completely obscure the orifice 204. However, in some embodiments, the end portion 226 does not completely obscure the orifice 204, but only partially obscures the orifice 204 when an electrical current is applied to the valve member 210.

When the current passing through the valve member 210 is reduced to a smaller magnitude, or is completely ceased, the valve member 210 cools down, experiences thermal contraction, and returns towards the position illustrated in FIG. 2C. Thus, the positioning of the end portion 226 with respect to the orifice 204 is controlled by modifying the current passing through the valve member 210. Consequently, the amount of fluid flow through the orifice 204 is controlled by adjusting the magnitude of the current passing through the valve member 210. In an example, the orifice 204 is completely uncovered at zero current through the valve member 210, the orifice 204 is completely covered by the end portion 226 at a prescribed maximum current through the valve member 210, and the orifice 204 is partially covered by the end portion 226 at a given fraction of the prescribed maximum current through the valve member 210. In such an example, a maximum fluid flowrate through the orifice 204 is realized at zero current through the valve member 210, zero flow through the orifice 204 is realized at the prescribed maximum current through the valve member 210, and a fraction of the maximum fluid flowrate through the orifice 204 is realized at the given fraction of the prescribed maximum current through the valve member 210.

In some embodiments, the applied current through the valve member 210 may be adjusted in steps, thereby providing one or more intermediate positions of the end portion 226 of the valve member 210 between fully uncovering the orifice 204 and completely obscuring the orifice 204. In such embodiments, the MEMS device 200 provides an intermediate fluid flowrate between zero flow and the maximum flowrate corresponding to each intermediate position of the end portion 226. In an example, the resulting fluid flowrate through the orifice 204 may be varied in increments (such as in 5% increments, 10% increments, or 20% increments) from zero to the maximum flow.

In some embodiments, the applied current through the valve member 210 may be continuously variable, thereby providing a continuously variable position of the end portion 226 of the valve member 210 between fully uncovering the orifice 204 and completely obscuring the orifice 204. In such embodiments, the MEMS device 200 provides a continuously variable fluid flowrate through the orifice 204 between zero flow and the maximum flowrate, the resulting flowrate corresponding to the intermediate position of the end portion 226.

In some embodiments, the applied current through the valve member 210 may be adjusted stepwise over a portion of the range from zero to maximum current, and may be continuously variable over another portion of the range from zero to maximum current. In such embodiments, the resulting fluid flowrate through the orifice 204 may be varied in steps over a portion of the range from zero to maximum flow, and may be continuously variable over another portion of the range from zero to maximum flow. In an example, the resulting fluid flowrate through the orifice 204 may be varied in steps from zero to 20% of the maximum flow, and may be varied continuously from 20% to the maximum flow.

Although FIGS. 2A-2D illustrate the MEMS device 200 to be configured with the orifice 204 normally open with no current applied, in some embodiments, the MEMS device 200 may be configured with the orifice 204 normally closed with no current applied. In such embodiments, the starting position for the valve member 210 includes the end portion 226 obscuring the orifice 204. In an example, the end portion 226 completely blocks passage of gas through the orifice 204. The application of a current through the valve member 210 causes deflection of the end 216 of the valve member, moving the end portion 226 to at least partially uncover the orifice 204, thereby permitting gas to flow through the orifice 204.

Any of the arrangements of MEMS devices in the present disclosure may include MEMS devices configured with a normally open orifice. Any of the arrangements of MEMS devices in the present disclosure may include MEMS devices configured with a normally closed orifice. Any of the arrangements of MEMS devices in the present disclosure may include a combination of MEMS devices configured with a normally open orifice and MEMS devices configured with a normally closed orifice.

Figure 2E:
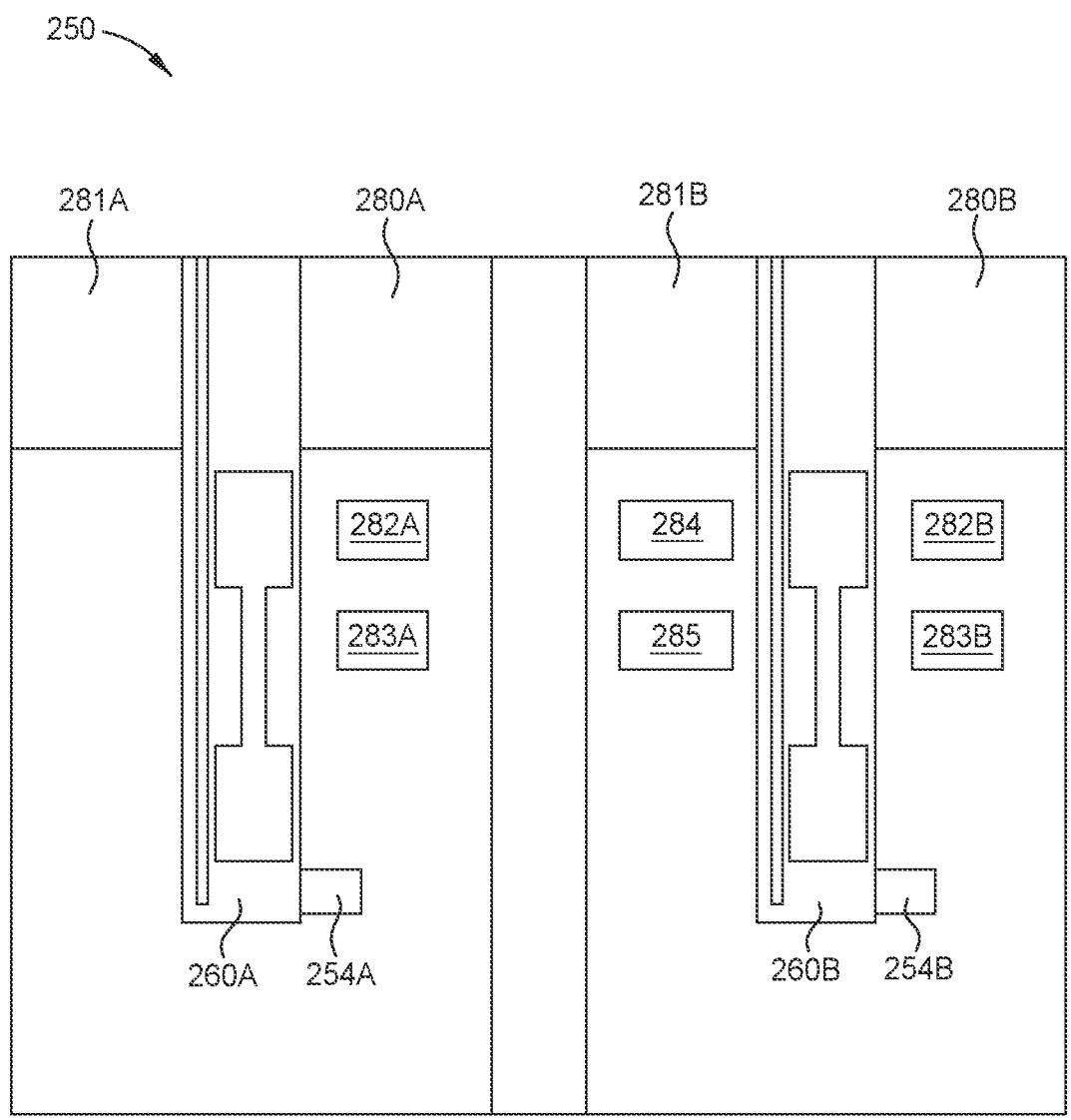
FIG. 2E is a plan view of the top of another exemplary MEMS device.

FIG. 2E is a plan view of the top of an exemplary MEMS device 250. MEMS device 250 is similar to MEMS device 200, but includes two orifices 254A, 254B and two valve members 260A, 260B. Valve member 260A is connected to contacts 280A, 281A, and regulates fluid flow through orifice 254A. Valve member 260B is connected to contacts 280B, 281B, and regulates fluid flow through orifice 254B. In some embodiments, a dedicated heater is associated with each orifice 254A, 254B; the heater associated with orifice 254A is connected to contacts 282A, 283A, and the heater associated with orifice 254B is connected to contacts 282B, 283B. A sensor (236, FIG. 2B), as described above, is connected to contacts 284, 285. In some embodiments, it is contemplated that valve member 260A and valve member 260B may be operated independently, and therefore orifice 254A and orifice 254B may be suitable for coupling to separate gas supplies.

To inhibit corrosion and/or reduce a probability that a valve member of a MEMS device may stick in position and become inoperable, it is contemplated that surfaces of each component of MEMS devices 200, 250 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

Figure 3:
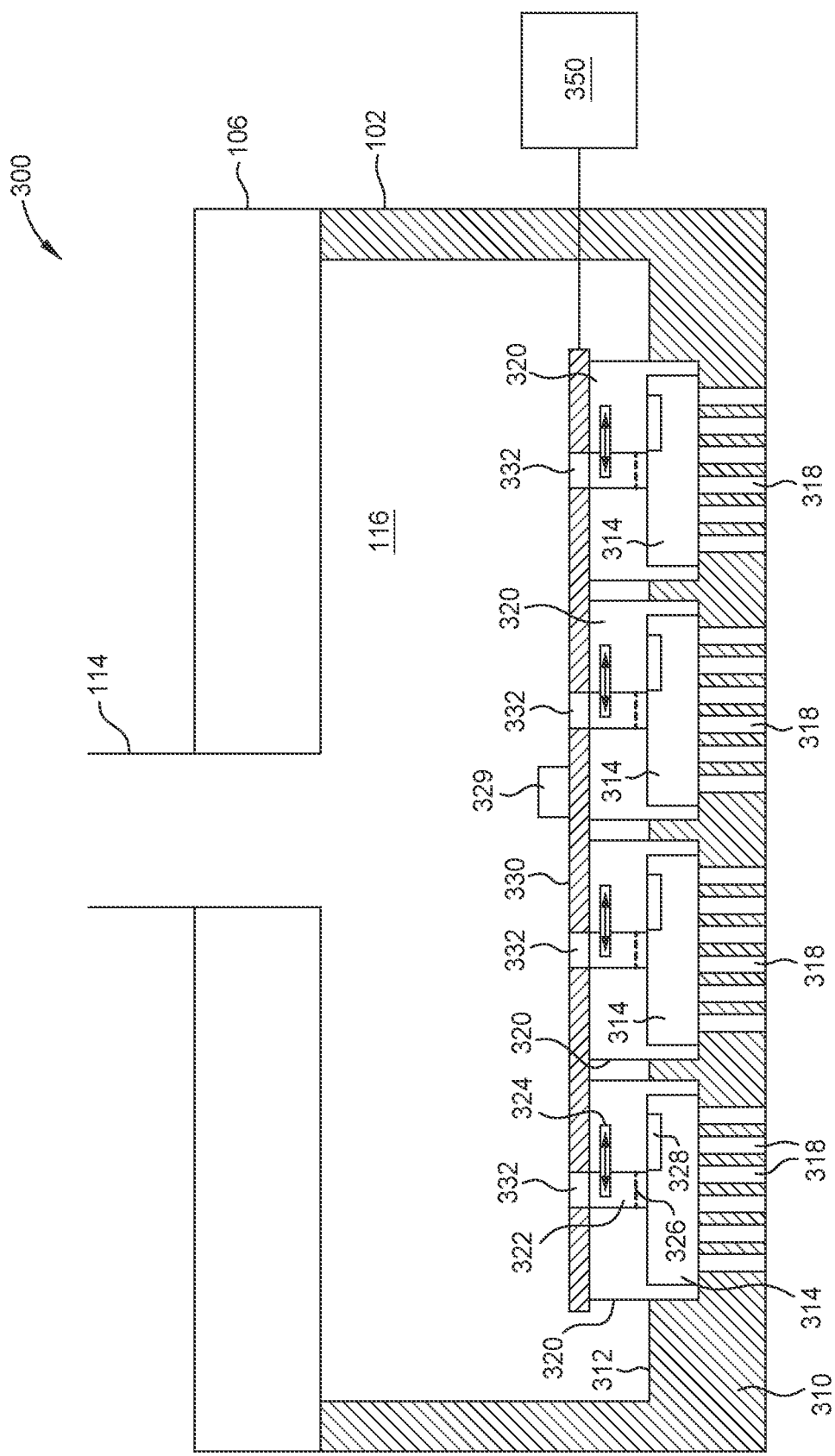
FIG. 3 is a schematic cross-sectional side view of an exemplary showerhead.

FIG. 3 is a schematic cross-sectional side view of an exemplary showerhead 300. It is contemplated that the configuration of showerhead 300 may be used as showerhead 112 of FIG. 1. Showerhead 300 includes a faceplate 310 with openings 318, through which gases flow from the plenum 116 into the processing volume (120, FIG. 1) of a processing chamber, such as processing chamber 100. A top surface 312 of the faceplate 310 includes compartments 314. As illustrated, each compartment 314 is recessed into the top surface 312. In some embodiments, the compartments 314 may not be recessed into the top surface 312. A cluster of openings 318 is associated with each compartment 314.

A MEMS device 320 is associated with each compartment 314. As illustrated, in embodiments in which a compartment 314 is recessed into the top surface 312 of the faceplate 310, the MEMS device 320 may be at least partially disposed in a corresponding compartment 314. It is contemplated that the MEMS device 320 may be configured similarly to MEMS device 200 or MEMS device 250. Each MEMS device 320 is schematically depicted to include an orifice 322, a valve member 324, a heater 326, and a sensor 328, such as described above for MEMS device 200. Each MEMS device 320 is coupled to a printed circuit board (PCB) 330. In some embodiments, each MEMS device 320 is soldered to the PCB 330. In some of such embodiments, the solder surrounds the orifice 322 and provides a seal between the PCB 330 and each MEMS device 320. Each contact of each MEMS device 320 is connected to the PCB 330. The sensor 328, the heater 326, and the valve member 324 of each MEMS device 320 receive electrical power via the PCB 330. The PCB 330 is coupled to a master controller 350 for the transmission of power and/or control signals and/or telemetry with each MEMS device 320.

The PCB 330 includes a port 332 associated with each MEMS device 320. When the valve member 324 of a MEMS device 320 permits gas to flow through the corresponding orifice 322, gas in the plenum 116 can flow through the corresponding port 332 in the PCB 330 and through the orifice 322 into the corresponding compartment 314 of the faceplate 310. In some embodiments, the gas is heated by the heater 326. The gas flows from the compartment 314 through the corresponding openings 318 in the faceplate 310 into the processing volume (120, FIG. 1) of the processing chamber.

As illustrated, in some embodiments, showerhead 300 may include one or more local controllers 329. Each local controller 329 may be associated with, and programmed to control, a corresponding single MEMS device 320 or a corresponding group of MEMS devices 320. In an example, each local controller 329 includes an application-specific integrated circuit (ASIC). In some embodiments, each local controller 329 may be integrated into a MEMS device 320. As illustrated, in some embodiments, each local controller 329 may be coupled to the PCB 330 separate from the MEMS device 320. In some embodiments, the local controller 329 includes an electromagnetic shield. To inhibit corrosion, it is contemplated that surfaces of the local controller 329 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

In some embodiments, the local controller 329 receives commands from master controller 350 via the PCB 330. It is contemplated that the commands may be in the form of a signal that is addressed to correspond with a specific device, such as a specific MEMS device 320. Each local controller 329 is programmed to recognize command signals addressed to correspond with devices under the purview of local controller 329, and controls the devices according to the commands received. In some embodiments, each local controller 329 is programmed to ignore command signals that are not addressed to correspond with any of the devices under the purview of local controller 329.

In some embodiments, each MEMS device 320 is independently addressable via a corresponding local controller 329, such that the operation of each MEMS device 320 can be controlled without changing the operating status of any other MEMS device 320. In some embodiments, each MEMS device 320 is assigned to one or more groups of MEMS devices 320, and each group of MEMS devices 320 is independently addressable via one or more corresponding local controllers 329. In such embodiments, the operation of each MEMS device 320 within a defined group can be controlled without changing the operating status of any other MEMS device 320 that is not within the defined group.

Figure 7:
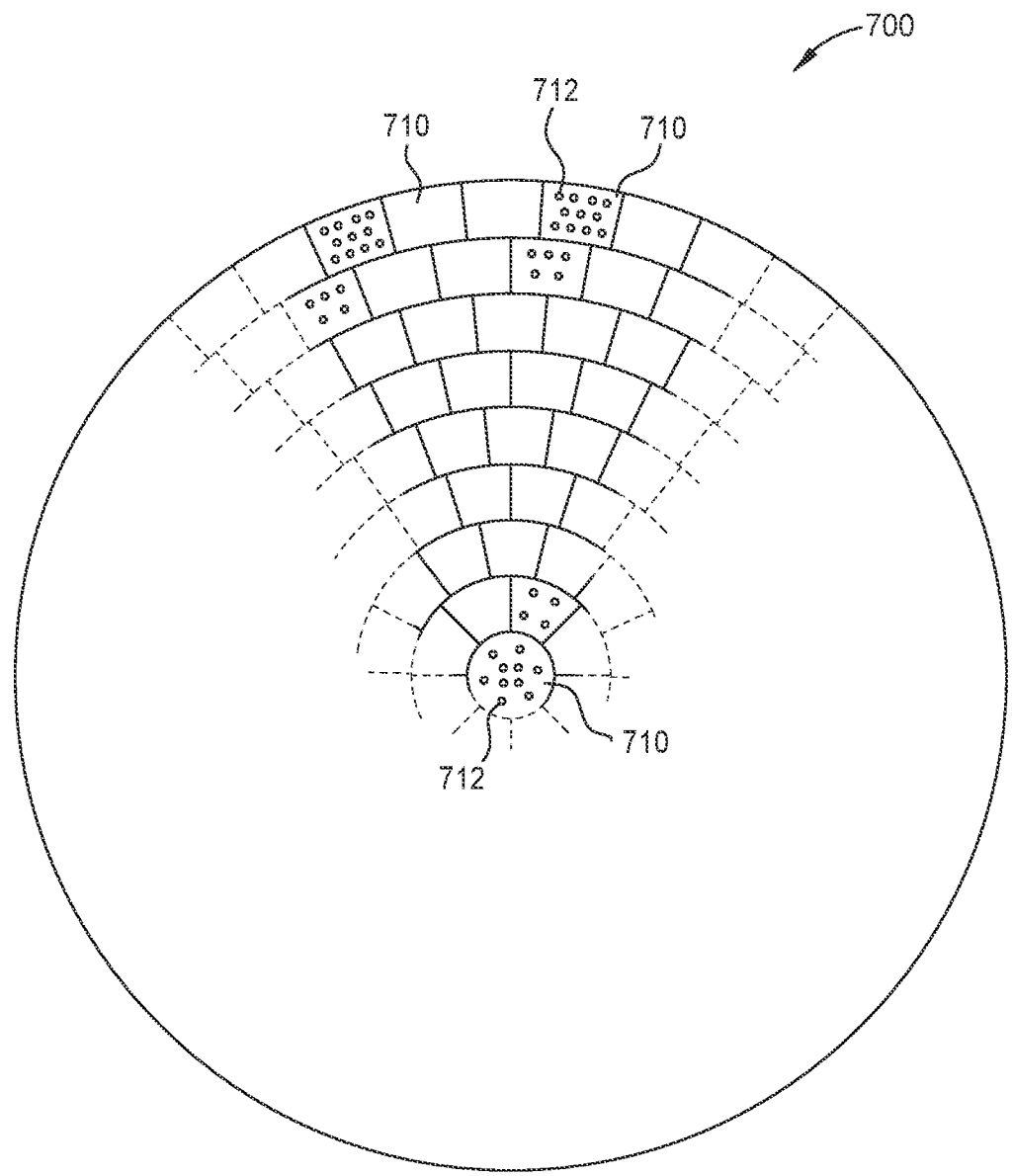
FIG. 7 is a schematic plan view of a faceplate of a showerhead.

In an example, each MEMS device 320 or group of MEMS devices 320 are associated with a discrete zone of the faceplate 310, such as illustrated by any zone 710 of faceplate 700 in FIG. 7. The control of each MEMS device 320, or group of MEMS devices 320, independently of other MEMS devices of showerhead 300 facilitates the adjustment of gas flow distribution across the zones of the faceplate 310.

In an example, a cluster of MEMS devices 320 at the center of the faceplate 310 are assigned to "Group A" and a cluster of MEMS devices 320 at an edge of the faceplate 310 are assigned to "Group B." The MEMS devices 320 of Group A can be controlled independently from the MEMS devices of Group B. Additionally, the MEMS devices 320 of Group A can be controlled via a command addressed to the group, and the MEMS devices 320 of Group B do not respond to the command addressed to Group A. In such an example, the MEMS devices 320 of Groups A and B can be controlled to adjust the quantity of process gas being delivered to the center of a substrate, such as substrate 154, relative to the quantity of process gas being delivered to the edge of the substrate.

In another example, a processing chamber, such as processing chamber 100, has an exhaust port (156, FIG. 1) located in an off-center position, which causes variations in gas flow at different locations within the processing volume (120, FIG. 1) of the processing chamber. Such azimuthal variations in gas flow can result in uneven processing of a substrate, such as a disparity of film thickness across the substrate. In such an example, a cluster of MEMS devices 320 near the exhaust port are assigned to "Group C" and a cluster of MEMS devices 320 further away from the exhaust port are assigned to "Group D." The MEMS devices 320 of Group C can be controlled independently from the MEMS devices of Group D. Additionally, the MEMS devices 320 of Group C can be controlled via a command addressed to the group, and the MEMS devices 320 of Group D do not respond to the command addressed to Group C. In such an example, the MEMS devices 320 of Groups C and D can be controlled to adjust the quantity of process gas being delivered to a portion of the substrate near to the exhaust port relative to the quantity of process gas being delivered to a portion of the substrate further away from the exhaust port.

In some embodiments, one or more MEMS devices 320 may be controlled according to a hierarchy of commands such that MEMS devices 320 not within a specific hierarchical set of MEMS devices 320 are unaffected by operating commands addressed to MEMS devices 320 within the specific hierarchical set. In an example, a particular MEMS device 320 is allocated to a small group of MEMS devices ("Group E1") which is part of a larger group of MEMS devices ("Group E"). In this example, the particular MEMS device 320 is also allocated to a different group of MEMS devices ("Group F") that contains other MEMS devices that are not within Group E. The particular MEMS device 320 can be controlled by commands addressed only to that particular MEMS device 320, and no other MEMS device will respond to those commands. The particular MEMS device 320 can be controlled also by commands addressed only to Group E1. All MEMS devices in Group E1, including that particular MEMS device 320, will respond to those commands, but no other MEMS device will respond to those commands. The particular MEMS device 320 can be controlled also by commands addressed only to Group E. All MEMS devices in Group E, including that particular MEMS device 320, will respond to those commands, but no other MEMS device will respond to those commands. The particular MEMS device 320 can be controlled also by commands addressed only to Group F. All MEMS devices in Group F, including that particular MEMS device 320, will respond to those commands, but no other MEMS device— including MEMS devices within Group E1 or Group E, unless those other MEMS devices are also allocated to Group F—will respond to those commands.

In embodiments in which local controller 329 is omitted, master controller 350 operates each MEMS device 320 via electrically conductive lines embedded in the PCB 330.

Figure 4A:
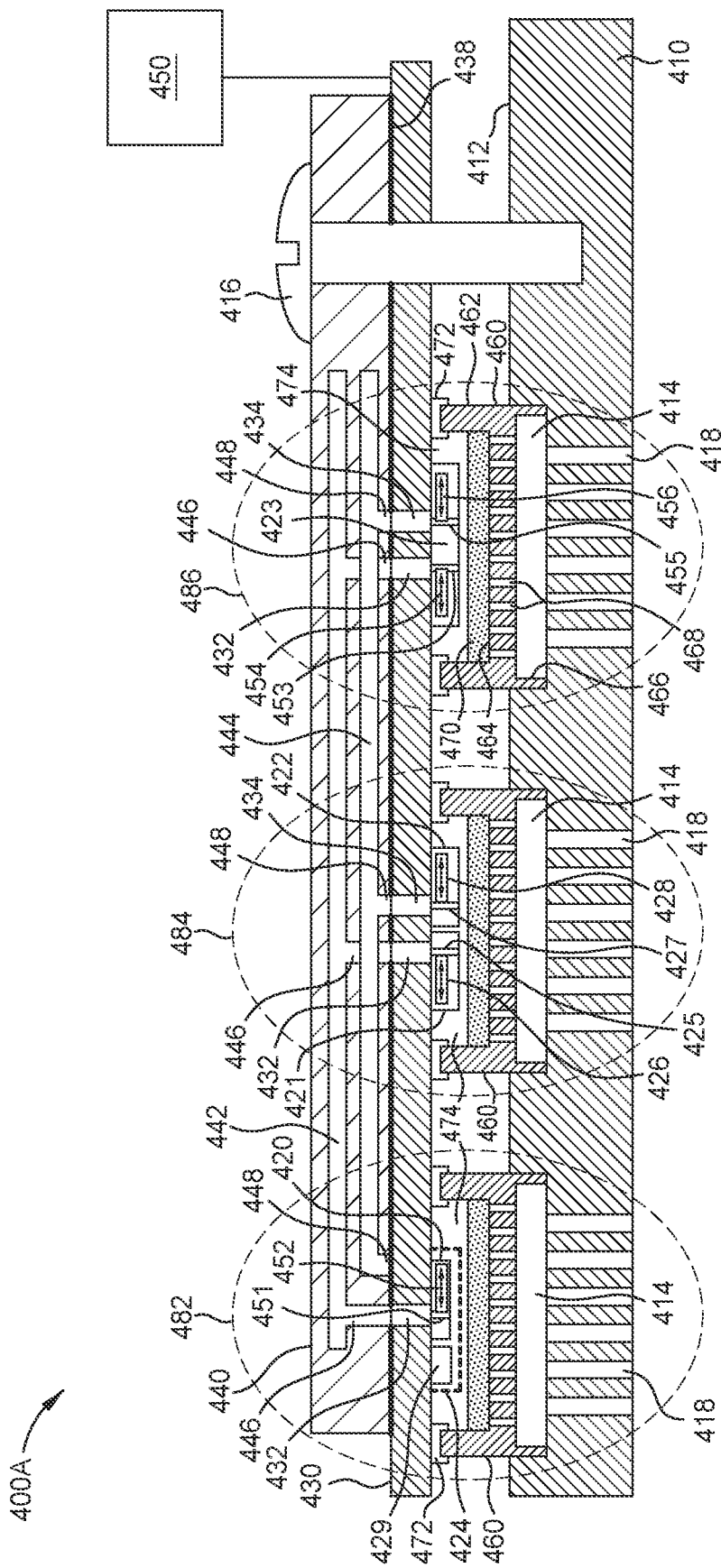
FIGS. 4A and 4B are schematic cross-sectional side view of exemplary showerheads.

FIG. 4A is a schematic cross-sectional side view of an exemplary showerhead 400A. It is contemplated that the configuration of showerhead 400A may be used as showerhead 112 of FIG. 1. Showerhead 400A includes a manifold 440 disposed on a PCB 430. The manifold 440 includes a first conduit 442 for passage of a first gas, and a second conduit 444 for passage of a second gas. It is contemplated that the first conduit 442 is isolated from the second conduit 444 such that the first gas and the second gas do not mix in the manifold 440. First ducts 446 from the first conduit 442 are aligned with first ports 432 in the PCB 430. Second ducts 448 from the second conduit 444 are aligned with second ports 434 in the PCB 430. An interface 438 between the manifold 440 and the PCB 430 is sealed, such as by bonding the manifold 440 to the PCB 430, to inhibit mixing of the first gas and the second gas at the interface 438.

In some embodiments, manifold 440 includes one or more additional conduits and corresponding ducts configured to convey one or more additional gases. In such embodiments, the one or more additional conduits may be isolated from the first conduit 442 and the second conduit 444. Furthermore, it is contemplated that the PCB 430 may include additional ports aligned with the additional ducts.

The showerhead 400A includes a faceplate 410 with openings 418, through which gases flow into the processing volume (120, FIG. 1) of a processing chamber, such as processing chamber 100. As illustrated, in some embodiments, the manifold 440 and PCB 430 are coupled to the faceplate 410 by one or more fastener 416, such as a screw or a bolt. A top surface 412 of the faceplate 410 includes compartments 414. As illustrated, each compartment 414 is recessed into the top surface 412. In some embodiments, the compartments 414 may not be recessed into the top surface 412. A cluster of openings 418 is associated with each compartment 414.

A spacer 460 is associated with each compartment 414. As illustrated, in embodiments in which a compartment 414 is recessed into the top surface 412 of the faceplate 410, the spacer 460 may be at least partially disposed in a corresponding compartment 414. Each spacer 460 includes sidewalls 462 and a floor 464. Although the sidewalls 462 are illustrated as extending to form a shroud 466 below the floor 464, in some embodiments, the shroud 466 may be omitted. Holes 468 in the floor 464 facilitate communication of gas to the openings 418 of the faceplate 410. As illustrated, in some embodiments, a diffuser 470 is disposed above the holes 468. The diffuser 470 can promote a uniform distribution of gas through the holes 468. In some embodiments, the diffuser 470 filters out particles entrained in the gas. Example diffusers 470 include a mesh (such as a sintered mesh), a porous metal filter, a foam (such as porous PTFE foam), or the like. In some embodiments, the diffuser 470 may be omitted.

The sidewalls 462 of the spacer 460 extend above the floor 464 to the PCB 430. As illustrated, in some embodiments, a gasket 472 seals an interface between the spacer 460 and the PCB 430. The gasket 472 may be made of any suitable material that can form a pressure seal and is resistant to chemical attack, such as an elastomer/thermoplastic material (such as an FKM type material, such as polyvinylidene difluoride (PVDF), including PVDF in the form of a closed cell foam), or the like. Each spacer 460 encloses a void space 474 between the PCB 430 and each corresponding compartment 414. The ports 432, 434 of the PCB 430 convey gas into the void spaces 474 enclosed by each spacer 460.

To inhibit corrosion, it is contemplated that the spacer 460 may be manufactured out of a corrosion-resistant material, such as a ceramic or a metal such as titanium. Additionally, or alternatively, surfaces of the spacer 460 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

It is contemplated that clusters of MEMS devices of showerhead 400A may be controlled in similar ways to the examples provided above with respect to clusters of MEMS devices 320 of showerhead 300.

FIG. 4A illustrates three exemplary configurations in which one or more MEMS devices 420, 421, 422, 423 with spacers 460, and attached to the PCB 430, can be associated with each compartment 414 of the faceplate 410. Each pairing of one or more MEMS devices 420, 421, 422, 423 with a corresponding compartment 414 may be considered as a discrete unit; each unit is described below.

In a first unit 482, the PCB 430 includes a port 432 aligned with a first duct 446 of the manifold 440, but does not include a port corresponding to a second duct 448 of the manifold 440. Consequently, the first unit 482 is configured to manage gas supplied via the first conduit 442 of the manifold 440, but is not configured to manage gas supplied via the second conduit 444 of the manifold 440. However, in alternative embodiments, the first unit 482 may be configured to manage gas supplied via the second conduit 444 of the manifold 440, but not configured to manage gas supplied via the first conduit 442 of the manifold 440. In such embodiments, the PCB 430 includes a port aligned with a second duct 448 of the manifold 440, but does not include a port corresponding to a first duct 446 of the manifold 440.

A MEMS device 420 within the void space 474 is coupled to the PCB 430, and regulates gas flow through the port 432 of the PCB 430. It is contemplated that the MEMS device 420 may be configured similarly to MEMS device 200. MEMS device 420 includes an orifice 451 and a valve member 452. In some embodiments, the MEMS device 420 is soldered to the PCB 430. In some of such embodiments, the solder surrounds the orifice 451 and provides a seal between the PCB 430 and the MEMS device 420. In some embodiments, the MEMS device 420 includes a sensor, such as sensor 236 (FIG. 2B). In some embodiments, a sensor separate from the MEMS device 420 is coupled to the PCB 430 within the void space 474. Such a sensor may measure any one or more of pressure, temperature, or flow rate. In some embodiments, the MEMS device 420 includes a heater. In some embodiments, as illustrated, a heater 424 separate from the MEMS device 420 is coupled to the PCB 430 within the void space 474. The sensor, the heater, and the valve member associated with each MEMS device 420, and heater 424 (if present) receive electrical power via the PCB 430.

As illustrated in the first unit 482, in some embodiments, a local controller 429 may be associated with, and programmed to control, the MEMS device 420. In an example, the local controller 429 includes an application-specific integrated circuit (ASIC). In some embodiments, the local controller 429 is integrated into the MEMS device 420. In some embodiments, the local controller 429 is coupled to the PCB 430 separate from the MEMS device 420. In some embodiments, the local controller 429 includes an electromagnetic shield. To inhibit corrosion, it is contemplated that surfaces of the local controller 429 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

In embodiments that include the local controller 429, the local controller 429 controls operation of the MEMS device 420 and/or the heater 424. In some embodiments, the local controller 429 receives commands from master controller 450 via the PCB 430. It is contemplated that the commands may be in the form of a signal that is addressed to correspond with a specific device, such as MEMS device 420 or heater 424. The local controller 429 in the first unit 482 is programmed to recognize command signals addressed to correspond with devices in the first unit 482 (such as MEMS device 420 or heater 424), and controls the devices according to the commands received. In some embodiments, the local controller 429 is programmed to ignore command signals that are not addressed to correspond with any of the devices under the purview of local controller 429, such as devices in the first unit 482. In some embodiments, the local controller 429 may be programmed to control one or more devices that are not in the first unit 482. In an example, the local controller 429 is programmed to control one or more MEMS devices in one or more units in addition to control MEMS device 420 and heater 424 of the first unit 482.

In some embodiments, each device in the first unit 482 is independently addressable via a corresponding local controller 429, such that the operation of each device in the first unit 482 can be controlled without changing the operating status of any other device of showerhead 400A. In some embodiments, each device in the first unit 482 is assigned to one or more groups of devices, and each group of devices is independently addressable via one or more corresponding local controllers 429. In such embodiments, the operation of each device within a defined group can be controlled without changing the operating status of any other device of showerhead 400A that is not within the defined group.

In embodiments in which the local controller 429 is omitted, master controller 450 operates the MEMS device 420 and the heater 424 via electrically conductive lines embedded in the PCB 430.

In a second unit 484, the PCB 430 includes a first port 432 aligned with a first duct 446 of the manifold 440, and a second port 434 aligned with a second duct 448 of the manifold 440. Consequently, the second unit 484 is configured to manage gas supplied via the first conduit 442 of the manifold 440 and via the second conduit 444 of the manifold 440.

A first MEMS device 421 in the void space 474 of the second unit 484 is coupled to the PCB 430, and regulates gas flow through the first port 432 of the PCB 430. A second MEMS device 422 in the void space 474 of the second unit 484 is coupled to the PCB 430, and regulates gas flow through the second port 434 of the PCB 430. It is contemplated that each MEMS device 421, 422 may be configured similarly to MEMS device 200. MEMS device 421 includes an orifice 425 and a valve member 426. MEMS device 422 includes an orifice 427 and a valve member 428. In some embodiments, each MEMS device 421, 422 is soldered to the PCB 430. In some of such embodiments, the solder surrounds each orifice 425, 427 and provides a seal between the PCB 430 and each MEMS device 421, 422. In some embodiments, at least one of the MEMS devices 421, 422 includes a sensor, such as sensor 236 (FIG. 2B). In some embodiments, a sensor separate from the MEMS devices 421, 422 is coupled to the PCB 430. Such a sensor may measure any one or more of pressure, temperature, or flow rate. In some embodiments, each MEMS device 421, 422 includes a heater. In some embodiments, a heater (such as heater 424 of the first unit 482) separate from the MEMS devices 421, 422 is coupled to the PCB 430.

In some embodiments, the second unit 484 includes a local controller, such as local controller 429 of the first unit 482. In such embodiments, it is contemplated that the local controller controls operation of at least one device (such as the MEMS devices 421, 422 and/or a separate heater, if present) in the second unit 484. In an example, the local controller is integrated into one of the MEMS devices 421, 422. In another example, the local controller is coupled to the PCB 430 separate from the MEMS devices 421, 422.

In some embodiments, each device in the second unit 484 is independently addressable via a corresponding local controller 429, such that the operation of each device in the second unit 484 can be controlled without changing the operating status of any other device of showerhead 400A. In some embodiments, each device in the second unit 484 is assigned to one or more groups of devices, and each group of devices is independently addressable via one or more corresponding local controllers 429. In such embodiments, the operation of each device within a defined group can be controlled without changing the operating status of any other device of showerhead 400A that is not within the defined group.

In a third unit 486, the PCB 430 includes a first port 432 aligned with a first duct 446 of the manifold 440, and a second port 434 aligned with a second duct 448 of the manifold 440. Consequently, the third unit 486 is configured to manage gas supplied via the first conduit 442 of the manifold 440 and via the second conduit 444 of the manifold 440.

A MEMS device 423 in the void space 474 of the third unit 486 is coupled to the PCB 430, and regulates gas flow through the first port 432 of the PCB 430 and through the second port 434 of the PCB 430. It is contemplated that the MEMS device 423 may be configured similarly to MEMS device 250. MEMS device 423 includes a first orifice 453 and a first valve member 454 for controlling gas flow through the first port 432 of the PCB 430, and includes a second orifice 455 and a second valve member 456 for controlling gas flow through the second port 434 of the PCB 430. In some embodiments, the MEMS device 423 is soldered to the PCB 430. In some of such embodiments, the solder surrounds the first orifice 453 and/or the second orifice 455, and provides a seal between the PCB 430 and the MEMS device 423. In some embodiments, the MEMS device 423 includes a sensor, such as sensor 236 (FIG. 2B). In some embodiments, a sensor separate from the MEMS device 423 is coupled to the PCB 430. Such a sensor may measure any one or more of pressure, temperature, or flow rate. In some embodiments, the MEMS device 423 includes a heater associated with the first orifice 453. In some embodiments, the MEMS device 423 includes a heater associated with the second orifice 455. In some embodiments, a heater (such as heater 424 of the first unit) separate from the MEMS device 423 is coupled to the PCB 430.

In some embodiments, the third unit 486 includes a local controller, such as local controller 429 of the first unit 482. In such embodiments, it is contemplated that the local controller controls operation of at least one device (such as the MEMS device 423 and/or a separate heater, if present) in the third unit 486. In an example, the local controller is integrated into the MEMS device 423. In another example, the local controller is coupled to the PCB 430 separate from the MEMS device 423.

In some embodiments, each device in the third unit 486 is independently addressable via a corresponding local controller 429, such that the operation of each device in the third unit 486 can be controlled without changing the operating status of any other device of showerhead 400A. In some embodiments, each device in the third unit 486 is assigned to one or more groups of devices, and each group of devices is independently addressable via one or more corresponding local controllers 429. In such embodiments, the operation of each device within a defined group can be controlled without changing the operating status of any other device of showerhead 400A that is not within the defined group.

Figure 4B:
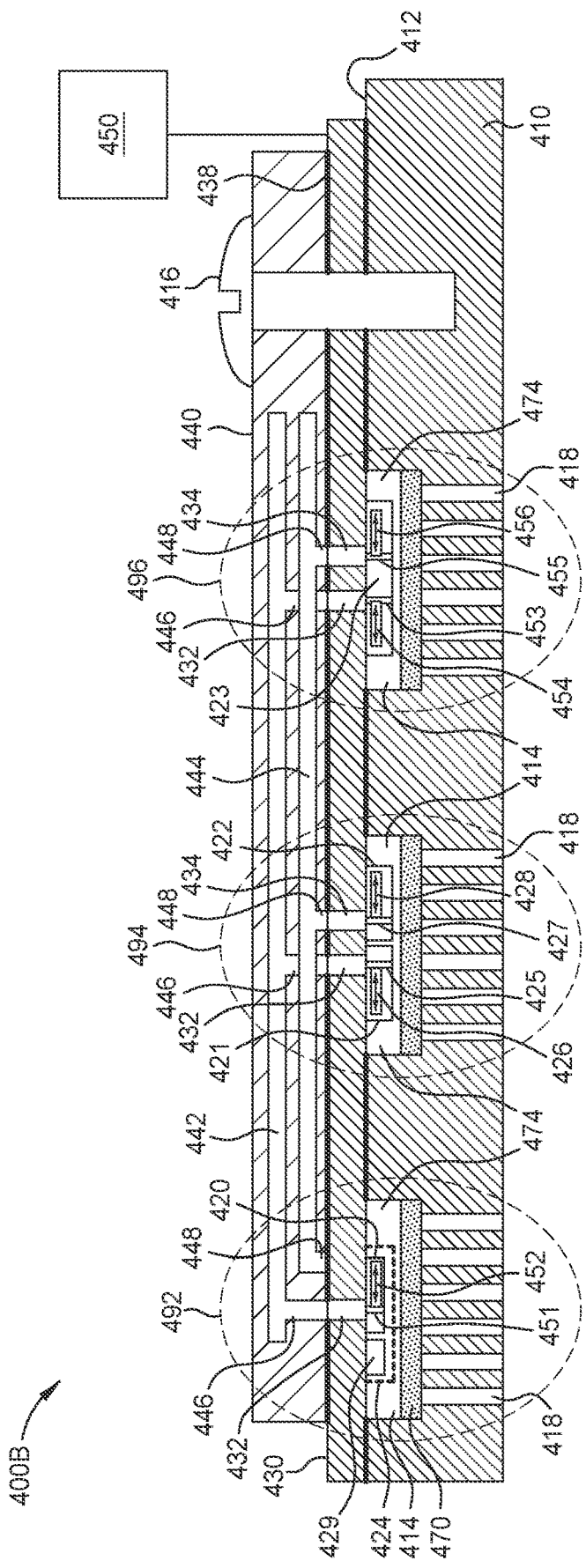

FIG. 4B is a schematic cross-sectional side view of an exemplary showerhead 400B, which is a variant of showerhead 400A. It is contemplated that the configuration of showerhead 400B may be used as showerhead 112 of FIG. 1.

FIG. 4B depicts the same components as in FIG. 4A, and the above description for FIG. 4A applies for FIG. 4B except that the spacers 460 are omitted, the PCB 430 is attached directly to the top surface 412 of the faceplate 410, and the void spaces 474 are within the faceplate 410. An interface between the faceplate 410 and the PCB 430 is sealed, such as by bonding the faceplate 410 to the PCB 430. As illustrated, in some embodiments, the manifold 440 and PCB 430 are coupled to the faceplate 410 by one or more fastener 416, such as a screw or a bolt. In some embodiments, the fastener 416 may be omitted.

First unit 492, second unit 494, and third unit 496 correspond to the first unit 482, second unit 484, and third unit 486, respectively, of FIG. 4A. As illustrated, in some embodiments, a diffuser 470 is disposed in each compartment 414 above the openings 418 in the faceplate 410. In some embodiments, the diffuser 470 may be omitted.

It is contemplated that clusters of MEMS devices of showerhead 400B may be controlled in similar ways to the examples provided above with respect to clusters of MEMS devices 320 of showerhead 300.

As illustrated, in some embodiments, the first unit 492 includes local controller 429, such as described above. In such embodiments, it is contemplated that the local controller 429 controls operation of at least one device (such as the MEMS device 420 and/or a separate heater 424, if present) in the first unit 492. In an example, the local controller 429 is integrated into the MEMS device 420. In some embodiments, the local controller 429 is coupled to the PCB 430 separate from the MEMS device 420. To inhibit corrosion, it is contemplated that surfaces of the local controller 429 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

In some embodiments, each device in the first unit 492 is independently addressable via a corresponding local controller 429, such that the operation of each device in the first unit 492 can be controlled without changing the operating status of any other device of showerhead 400B. In some embodiments, each device in the first unit 492 is assigned to one or more groups of devices, and each group of devices is independently addressable via one or more corresponding local controllers 429. In such embodiments, the operation of each device within a defined group can be controlled without changing the operating status of any other device of showerhead 400B that is not within the defined group.

In some embodiments, the second unit 494 includes a local controller, such as local controller 429 of FIG. 4A. In such embodiments, it is contemplated that the local controller controls operation of at least one device (such as the MEMS devices 421, 422 and/or a separate heater, if present) in the second unit 494. In an example, the local controller is integrated into one of the MEMS devices 421, 422. In another example, the local controller is coupled to the PCB 430 separate from the MEMS devices 421, 422.

In some embodiments, each device in the second unit 494 is independently addressable via a corresponding local controller 429, such that the operation of each device in the second unit 494 can be controlled without changing the operating status of any other device of showerhead 400B. In some embodiments, each device in the second unit 494 is assigned to one or more groups of devices, and each group of devices is independently addressable via one or more corresponding local controllers 429. In such embodiments, the operation of each device within a defined group can be controlled without changing the operating status of any other device of showerhead 400B that is not within the defined group.

In some embodiments, the third unit 496 includes a local controller, such as local controller 429 of FIG. 4A. In such embodiments, it is contemplated that the local controller controls operation of at least one device (such as the MEMS device 423 and/or a separate heater, if present) in the third unit 496. In an example, the local controller is integrated into the MEMS device 423. In another example, the local controller is coupled to the PCB 430 separate from the MEMS device 423.

In some embodiments, each device in the third unit 496 is independently addressable via a corresponding local controller 429, such that the operation of each device in the third unit 496 can be controlled without changing the operating status of any other device of showerhead 400B. In some embodiments, each device in the third unit 496 is assigned to one or more groups of devices, and each group of devices is independently addressable via one or more corresponding local controllers 429. In such embodiments, the operation of each device within a defined group can be controlled without changing the operating status of any other device of showerhead 400B that is not within the defined group.

In some embodiments, the second unit 484 of FIG. 4A and the second unit 494 of FIG. 4B may be configured to provide independent control of a first gas flow through the first port 432 of the PCB 430 and a second gas flow through the second port 434 of the PCB 430. For example, an operator can configure the second unit 484 of FIG. 4A or the second unit 494 of FIG. 4B to operate under any one of four modes: (i) flow gas from the first conduit 442 of the manifold 440 only; (ii) flow gas from the second conduit 444 of the manifold 440 only; (iii) flow gas from both the first conduit 442 and the second conduit 444 of the manifold 440; and (iv) do not flow gas from the manifold 440.

In the first mode, valve member 426 of MEMS device 421 is positioned to at least partially uncover orifice 425, and valve member 428 of MEMS device 422 is positioned to obscure orifice 427. In the second mode, valve member 426 of MEMS device 421 is positioned to obscure orifice 425, and valve member 428 of MEMS device 422 is positioned to at least partially uncover orifice 427. In the third mode, valve member 426 of MEMS device 421 is positioned to at least partially uncover orifice 425, and valve member 428 of MEMS device 422 is positioned to at least partially uncover orifice 427. In the fourth mode, valve member 426 of MEMS device 421 is positioned to obscure orifice 425, and valve member 428 of MEMS device 422 is positioned to obscure orifice 427.

It is contemplated that an operator can configure the second unit 484 of FIG. 4A or the second unit 494 of FIG. 4B to switch from one of the first, second, third, or fourth modes to another of the first, second, third, or fourth modes. In an example, an operator may control the second unit 484 of FIG. 4A or the second unit 494 of FIG. 4B to switch between modes in order to adjust a composition of process gases within a zone of a processing volume (120, FIG. 1) of a processing chamber (100, FIG. 1).

In some embodiments, the third unit 486 of FIG. 4A and the third unit 496 of FIG. 4B may be configured to provide independent control of a first gas flow through the first port 432 of the PCB 430 and a second gas flow through the second port 434 of the PCB 430. For example, an operator can configure the third unit 486 of FIG. 4A or the third unit 496 of FIG. 4B to operate under any one of four modes: (i) flow gas from the first conduit 442 of the manifold 440 only; (ii) flow gas from the second conduit 444 of the manifold 440 only; (iii) flow gas from both the first conduit 442 and the second conduit 444 of the manifold 440; and (iv) do not flow gas from the manifold 440.

In the first mode, first valve member 454 of MEMS device 423 is positioned to at least partially uncover first orifice 453, and second valve member 456 of MEMS device 423 is positioned to obscure second orifice 455. In the second mode, first valve member 454 of MEMS device 423 is positioned to obscure first orifice 453, and second valve member 456 of MEMS device 423 is positioned to at least partially uncover second orifice 455. In the third mode, first valve member 454 of MEMS device 423 is positioned to at least partially uncover first orifice 453, and second valve member 456 of MEMS device 423 is positioned to at least partially uncover second orifice 455. In the fourth mode, first valve member 454 of MEMS device 423 is positioned to obscure first orifice 453, and second valve member 456 of MEMS device 423 is positioned to obscure second orifice 455.

It is contemplated that an operator can configure the third unit 486 of FIG. 4A or the third unit 496 of FIG. 4B to switch from one of the first, second, third, or fourth modes to another of the first, second, third, or fourth modes. In an example, an operator may control the third unit 486 of FIG. 4A or the third unit 496 of FIG. 4B to switch between modes in order to adjust a composition of process gases within a zone of a processing volume (120, FIG. 1) of a processing chamber (100, FIG. 1).

The configuration of manifold 440 and PCB 430 depicted in FIGS. 4A and 4B facilitates expedient switching of gases that are flowed through the showerheads 400A and 400B. In an example, a first processing operation involves flowing a first gas through first conduit 442, first ducts 446, first ports 432, one or more MEMS devices 420, 421, 423, and through openings 418 of the faceplate 410 into a processing volume of a processing chamber. A second processing operation involves flowing a different second gas through first conduit 442, first ducts 446, first ports 432, one or more MEMS devices 420, 421, 423, and through openings 418 of the faceplate 410 into the processing volume of the processing chamber. In the event that it is detrimental or undesirable to mix the first gas and the second gas, then the first gas must be purged out of the first conduit 442, the first ducts 446, the first ports 432, the one or more MEMS devices 420, 421, 423, and the processing chamber before flowing the second gas. Because the total volume of the first conduit 442 and the first ducts 446 of the manifold plus the first ports 432 of the PCB 430 is less than the volume of a plenum, such as plenum 116, the quantity of first gas that must be purged and potentially wasted is less for a processing chamber incorporating showerhead 400A or 400B than for a processing chamber that delivers process gases via a plenum. Additionally, the time required for the purging operation is less for a processing chamber incorporating showerhead 400A or 400B than for a processing chamber that delivers process gases via a plenum. Consequently, a processing chamber incorporating showerhead 400A or 400B provides operational efficiencies of time, gas wastage, throughput, and cost over a processing chamber that delivers process gases via a plenum.

The configuration of manifold 440 and PCB 430 depicted in FIGS. 4A and 4B facilitates expedient simultaneous delivery of gases that are flowed through the showerheads 400A and 400B. In an example, a first gas is flowed through first conduit 442, first ducts 446, and one or more MEMS devices 421, 423. A second gas is flowed through second conduit 444, second ducts 448, and one or more MEMS devices 422, 423. The first and second gases are mixed in the void spaces 474 of the second units 484, 494 and third units 486, 496 before passing through the openings 418 of faceplate 410. The MEMS devices 421, 422, 423 facilitate localized adjustments to the ratio of first and second gases within each unit 484, 486, 494, 496. Furthermore, the MEMS devices 421, 422, 423 facilitate localized adjustments to the combined flowrate of first and second gases within each unit 484, 486, 494, 496.

Consequently, the flowrates and relative quantities of the first and second gas within different regions of the processing volume of a processing chamber can be tailored. In some embodiments, the flowrates and relative quantities of the first and second gas are adjusted towards being uniform across the processing volume. In some embodiments, the flowrates and relative quantities of the first and second gas are adjusted to provide a greater flow of gas in a first region of the processing volume and a lesser flow of gas in a second region of the processing volume. In some embodiments, the flowrates and relative quantities of the first and second gas are adjusted to provide a greater proportion of the first gas than the second gas in a first region of the processing volume, and a greater proportion of the second gas than the first gas in a second region of the processing volume.

Figure 5A:
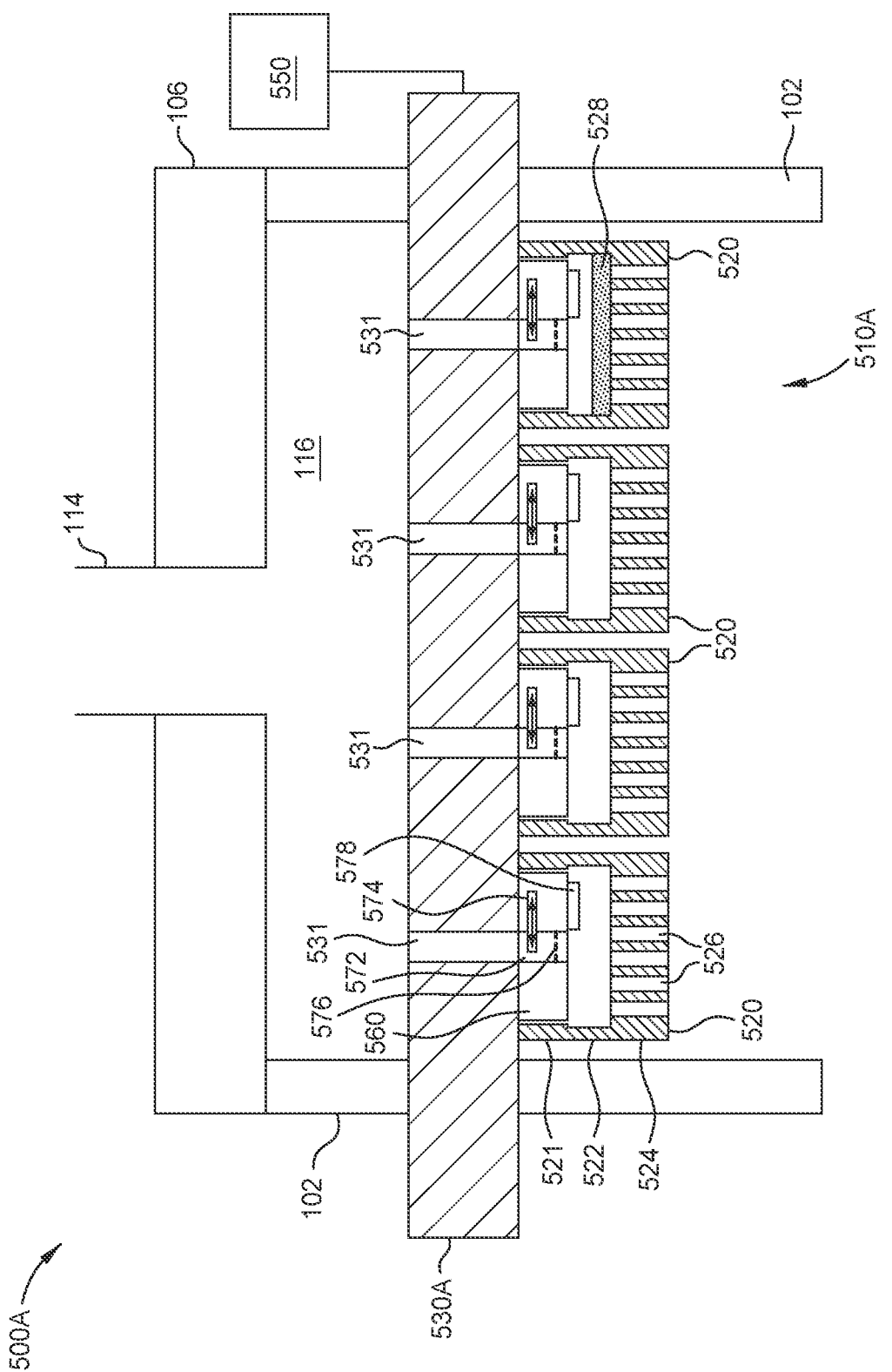
FIGS. 5A and 5B are schematic cross-sectional side views of exemplary showerheads.

FIG. 5A is a schematic cross-sectional side view of an exemplary showerhead 500A. It is contemplated that the configuration of showerhead 500A may be used as showerhead 112 of FIG. 1. Showerhead 500A includes a faceplate 510A formed of multiple MEMS modules 520 that are suspended from a PCB 530A. It is contemplated that the PCB 530A may be configured similarly to PCB 330 of FIG. 3. As illustrated, in some embodiments, a portion of the PCB 530A may extend through the chamber body 102 of the processing chamber. Such a configuration facilitates connection to a master controller 550 external to the processing chamber.

Each MEMS module 520 includes a body 521 with sidewalls 522 containing a MEMS device 560. In some embodiments, the body 521 is integrated with MEMS device 560. In some embodiments, the body 521 may be attached to MEMS device 560. In another embodiment, the body 521 is attached to the PCB 530A separately from the MEMS device 560. The sidewalls 522 extend below MEMS device 560 to a base 524. One or more holes 526 in the base 524 facilitate gases to flow through the MEMS module 560 and into the processing volume (120, FIG. 1) of a processing chamber, such as processing chamber 100. In some embodiments, a diffuser 528 is disposed above the one or more holes. The diffuser 528 facilitates a uniform distribution of gas through the one or more holes 526. In some embodiments, the diffuser 528 filters out particles entrained in the gas. Example diffusers 528 include a mesh (such as a sintered mesh), a porous metal filter, a foam (such as porous PTFE foam), or the like. In some embodiments, the diffuser 528 may be omitted.

To inhibit corrosion, it is contemplated that each MEMS module 520 may be manufactured out of a corrosion-resistant material, such as a ceramic or a metal, such as titanium. Additionally, or alternatively, surfaces of each MEMS module 520 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

Each MEMS device 560 associated with a corresponding MEMS module 520 may be configured similarly to MEMS device 200. Each MEMS device 560 is schematically depicted to include an orifice 572, a valve member 574, a heater 576, and a sensor 578, such as described above for MEMS device 200. Each MEMS device 560 is coupled to the PCB 530A. In some embodiments, the MEMS device 560 is soldered to the PCB 530A. In some of such embodiments, the solder surrounds the orifice 572 and provides a seal between the PCB 530A and the MEMS device 560. Each contact of each MEMS device 560 is connected to the PCB 530A. The sensor 578, the heater 576, and the valve member 574 of each MEMS device 560 receive electrical power via the PCB 530A. In some embodiments, sensor 578 is omitted, and a sensor separate from the MEMS device 560 is coupled to the PCB 530A. Such a sensor may measure any one or more of pressure, temperature, or flow rate. In some embodiments, heater 576 is omitted, and a heater separate from the MEMS device 560 is coupled to the PCB 530A. The PCB 530A is coupled to a master controller 550 for the transmission of power and/or control signals and/or telemetry with each MEMS device 560.

The PCB 530A includes a port 531 associated with each MEMS device 560. When the valve member 574 of a MEMS device 560 permits gas to flow through the corresponding orifice 572, gas in the plenum 116 can flow through the corresponding port 531 in the PCB 530A and through the orifice 572 into the corresponding MEMS module 520. In some embodiments, the gas is heated by the heater 576. The gas then flows through the one or more holes 526 in the base 524 of the MEMS module 520.

In some embodiments, the MEMS module 520 includes a local controller, such as local controller 429 of FIG. 4A. In such embodiments, it is contemplated that the local controller controls operation of at least one device (such as the MEMS device 560 and/or a separate heater, if present) in the MEMS module 520. In an example, the local controller is integrated into the MEMS module 520, such as by being integrated into the MEMS device 560. In another example, the local controller is coupled to the PCB 530A separate from the MEMS device 520.

In some embodiments, each device (such as MEMS device 560 and/or a separate heater) in the MEMS module 520 is independently addressable via a corresponding local controller, such as local controller 329, 429. The operation of each device in the MEMS module 520 can be controlled without changing the operating status of any other device of showerhead 500A. In some embodiments, each device in the MEMS module 520 is assigned to one or more groups of devices, and each group of devices is independently addressable via one or more corresponding local controllers. In such embodiments, the operation of each device within a defined group can be controlled without changing the operating status of any other device of showerhead 500A that is not within the defined group.

It is contemplated that clusters of devices and/or clusters of MEMS modules 520 of showerhead 500A may be controlled in similar ways to the examples provided above with respect to clusters of MEMS devices 320 of showerhead 300.

Figure 5B:
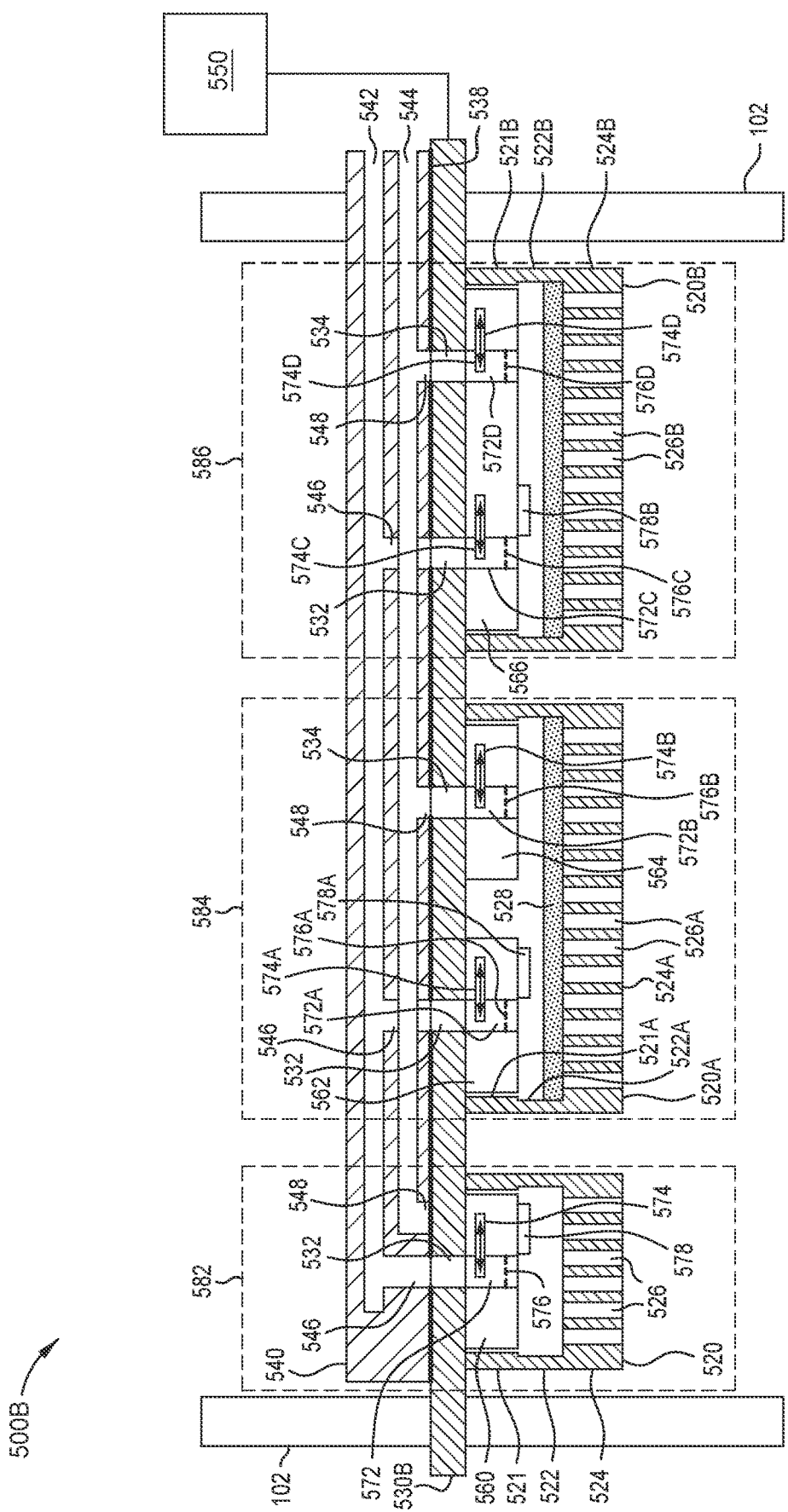

FIG. 5B is a schematic cross-sectional side view of an exemplary showerhead 500B, which is a variant of showerhead 500A, and incorporates elements of showerhead 400B. It is contemplated that the configuration of showerhead 500B may be used as showerhead 112 of FIG. 1. Showerhead 500B includes a faceplate 510B formed of multiple MEMS modules 520, 520A, 520B that are suspended from a PCB 530B. It is contemplated that the PCB 530B may be configured similarly to PCB 430 of FIGS. 4A and 4B. Showerhead 500B includes a manifold 540 disposed on the PCB 530B. The manifold 540 includes a first conduit 542 for passage of a first gas, and a second conduit 544 for passage of a second gas. It is contemplated that the first conduit 542 is isolated from the second conduit 544 such that the first gas and the second gas do not mix in the manifold 540. First ducts 546 from the first conduit 542 are aligned with first ports 532 in the PCB 530B. Second ducts 548 from the second conduit 544 are aligned with second ports 534 in the PCB 530B. An interface 538 between the manifold 540 and the PCB 530B is sealed, such as by bonding the manifold 540 to the PCB 530B, to inhibit mixing of the first gas and the second gas at the interface 538. The PCB 530B is coupled to master controller 550 for the transmission of power and/or control signals and/or telemetry with MEMS devices attached to the PCB 530B. As illustrated, in some embodiments, a portion of the PCB 530B may extend through the chamber body 102 of the processing chamber. Such a configuration facilitates connection to master controller 550.

In some embodiments, manifold 540 includes one or more additional conduits and corresponding ducts configured to convey one or more additional gases. In such embodiments, the one or more additional conduits may be isolated from the first conduit 542 and the second conduit 544. Furthermore, it is contemplated that the PCB 530B may include additional ports aligned with the additional ducts. As illustrated, in some embodiments, a portion of the manifold 540 may extend through the chamber body 102 of the processing chamber. Such a configuration facilitates connection to one or more gas supplies.

It is contemplated that clusters of devices and/or clusters of MEMS modules 520, 520A, 520B of showerhead 500B may be controlled in similar ways to the examples provided above with respect to clusters of MEMS devices 320 of showerhead 300.

FIG. 5B illustrates three exemplary configurations in which one or more MEMS modules 520, 520A, 520B are attached to the PCB 530B. Each attachment of a MEMS module 520, 520A, 520B with a corresponding portion of the PCB 530B may be considered as a discrete unit; each unit is described below.

A first unit 582 includes MEMS module 520 (as described above), a second unit 584 includes MEMS module 520A, and a third unit 586 includes MEMS module 520B. MEMS module 520A includes a body 521A, sidewalls 522A, and a base 524A with one or more holes 526A, as described above for MEMS module 520. MEMS module 520B includes a body 521B, sidewalls 522B, and a base 524B with one or more holes 526B, as described above for MEMS module 520.

To inhibit corrosion, it is contemplated that each MEMS module 520, 520A, 520B may be manufactured out of a corrosion-resistant material, such as a ceramic or a metal such as titanium. Additionally, or alternatively, surfaces of each MEMS module 520, 520A, 520B may be coated with one or more suitable materials. Examples of coating materials include silicon carbide, parylenes, hydrophobic antistiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

In the first unit 582, the PCB 530B includes a port 532 aligned with a first duct 546 of the manifold 540, but does not include a port corresponding to a second duct 548 of the manifold 540. Consequently, the first unit 582 is configured to manage gas supplied via the first conduit 542 of the manifold, but is not configured to manage gas supplied via the second conduit 544 of the manifold 540. However, in alternative embodiments, the first unit 582 may be configured to manage gas supplied via the second conduit 544 of the manifold 540, but not configured to manage gas supplied via the first conduit 542 of the manifold 540. In such embodiments, the PCB 530B includes a port aligned with a second duct 548 of the manifold 540, but does not include a port corresponding to a first duct 546 of the manifold 540.

MEMS module 520, as described above, is attached to the PCB 530B. A MEMS device 560 associated with MEMS module 520 coupled to the PCB 530B regulates gas flow through the port 532 of the PCB 530B. It is contemplated that the MEMS device 560 may be configured similarly to MEMS device 200. The MEMS device 560 is schematically depicted to include an orifice 572, a valve member 574, a heater 576, and a sensor 578, such as described above for MEMS device 200. The MEMS device 560 is coupled to the PCB 530B. In some embodiments, the MEMS device 560 is soldered to the PCB 530B. In some of such embodiments, the solder surrounds the orifice 572 and provides a seal between the PCB 530B and the MEMS device 560. Each contact of the MEMS device 560 is connected to the PCB. The sensor 578, the heater 576, and the valve member 574 of the MEMS device 560 receive electrical power via the PCB 530B.

In some embodiments, sensor 578 is omitted, and a sensor separate from the MEMS device 560 is coupled to the PCB 530B. Such a sensor may measure any one or more of pressure, temperature, or flow rate. In some embodiments, heater 576 is omitted, and a heater separate from the MEMS device 560 is coupled to the PCB 530B. The PCB 530B is coupled to a master controller 550 for the transmission of power and/or control signals and/or telemetry with the MEMS device 560.

In some embodiments, the MEMS module 520 includes a diffuser, such as diffuser 528 described above. In some embodiments, the diffuser may be omitted.

In some embodiments, the first unit 582 includes a local controller, such as local controller 429 of FIG. 4A. In such embodiments, it is contemplated that the local controller controls operation of at least one device (such as the MEMS device 560 and/or a separate heater, if present) in the first unit 582. In an example, the local controller is integrated into the MEMS module 520, such as by being integrated into the MEMS device 560. In another example, the local controller is coupled to the PCB 530B separate from the MEMS device 560.

In some embodiments, each device in the first unit 582 is independently addressable via a corresponding local controller (such as local controller 429), such that the operation of each device in the first unit 582 can be controlled without changing the operating status of any other device of showerhead 500B. In some embodiments, each device in the first unit 582 is assigned to one or more groups of devices, and each group of devices is independently addressable via one or more corresponding local controllers. In such embodiments, the operation of each device within a defined group can be controlled without changing the operating status of any other device of showerhead 500B that is not within the defined group.

In the second unit 584, the PCB 530B includes a first port 532 aligned with a first duct 546 of the manifold 540, and a second port 534 aligned with a second duct 544 of the manifold 540. Consequently, the second unit 584 is configured to manage gas supplied via the first conduit 542 of the manifold 540 and via the second conduit 544 of the manifold 540.

MEMS module 520A is attached to the PCB 530B. MEMS module 520A includes a first MEMS device 562 coupled to the PCB 530B that regulates gas flow through the first port 532 of the PCB 530B. MEMS module 520A includes a second MEMS device 564 coupled to the PCB 530B that regulates gas flow through the second port 534 of the PCB 530B. It is contemplated that each MEMS device 562, 564 may be configured similarly to MEMS device 200.

Each MEMS device 562, 564 is schematically depicted to include, respectively, an orifice 572A, 572B; a valve member 574A, 574B; and a heater 576A, 576B; such as described above for MEMS device 200. In some embodiments, heaters 576A, 576B may be omitted, and a heater separate from each MEMS device 562, 564 is coupled to the PCB 530B. As illustrated, in some embodiments, at least one of the MEMS devices 562, 564 includes a sensor 578A, such as sensor 236. In some embodiments, sensor 578A is omitted, and a sensor separate from the MEMS devices 562, 564 is coupled to the PCB 530B. Such a sensor may measure any one or more of pressure, temperature, or flow rate. Each MEMS device 562, 564 is coupled to the PCB 530B. In some embodiments, each MEMS device 562, 564 is soldered to the PCB 530B. In some of such embodiments, the solder surrounds each orifice 572A, 572B and provides a seal between the PCB 530B and each MEMS device 562, 564. Each contact of each MEMS device 562, 564 is connected to the PCB 530B. The sensor 578A; the heater 576A, 576B (including a separate heater when present); and the valve member 574A, 574B of each MEMS device 562, 564 receive electrical power via the PCB 530B.

In some embodiments, the MEMS module 520A includes a diffuser, such as diffuser 528 described above. In some embodiments, the diffuser may be omitted.

In some embodiments, the second unit 584 includes a local controller, such as local controller 429 of FIG. 4A. In such embodiments, it is contemplated that the local controller controls operation of at least one device (such as the MEMS devices 562, 564 and/or a separate heater, if present) in the second unit 584. In an example, the local controller is integrated into one of the MEMS devices 562, 564. In another example, the local controller is coupled to the PCB 530B separate from the MEMS devices 562, 564.

In some embodiments, each device in the second unit 584 is independently addressable via a corresponding local controller (such as local controller 429), such that the operation of each device in the second unit 584 can be controlled without changing the operating status of any other device of showerhead 500B. In some embodiments, each device in the second unit 584 is assigned to one or more groups of devices, and each group of devices is independently addressable via one or more corresponding local controllers. In such embodiments, the operation of each device within a defined group can be controlled without changing the operating status of any other device of showerhead 500B that is not within the defined group.

In some embodiments, the second unit 584 may be configured to provide independent control of a first gas flow through the first port 532 of the PCB 530B and a second gas flow through the second port 534 of the PCB 530B. For example, an operator can configure the second unit 584 to operate under any one of four modes: (i) flow gas from the first conduit 542 of the manifold 540 only; (ii) flow gas from the second conduit 544 of the manifold 540 only; (iii) flow gas from both the first conduit 542 and the second conduit 544 of the manifold 540; and (iv) do not flow gas from the manifold 540.

In the first mode, valve member 574A of MEMS device 562 is positioned to at least partially uncover orifice 572A, and valve member 574B of MEMS device 564 is positioned to obscure orifice 572B. In the second mode, valve member 574A of MEMS device 562 is positioned to obscure orifice 572A, and valve member 574B of MEMS device 564 is positioned to at least partially uncover orifice 572B. In the third mode, valve member 574A of MEMS device 562 is positioned to at least partially uncover orifice 572A, and valve member 574B of MEMS device 564 is positioned to at least partially uncover orifice 572B. In the fourth mode, 574A of MEMS device 562 is positioned to obscure orifice 572A, and valve member 574B of MEMS device 564 is positioned to obscure orifice 572B.

It is contemplated that an operator can configure the second unit 584 to switch from one of the first, second, third, or fourth modes to another of the first, second, third, or fourth modes. In an example, an operator may control the second unit 584 to switch between modes in order to adjust a composition of process gases within a zone of a processing volume (120, FIG. 1) of a processing chamber (100, FIG. 1).

In the third unit 586, the PCB 530B includes a first port 532 aligned with a first duct 546 of the manifold 540, and a second port 534 aligned with a second duct 548 of the manifold 540. Consequently, the third unit 586 is configured to manage gas supplied via the first conduit 542 of the manifold 540 and via the second conduit 542 of the manifold 540.

MEMS module 520B is attached to the PCB 530B. MEMS module 520B includes a MEMS device 566 coupled to the PCB 530B that regulates gas flow through the first port 532 of the PCB 530B and regulates gas flow through the second port 534 of the PCB 530B. It is contemplated that the MEMS device 566 may be configured similarly to MEMS device 250.

The MEMS device 566 is schematically depicted to include a first orifice 572C and a first valve member 574C for controlling gas flow through the first port 532 of the PCB 530B, such as described above for MEMS device 250. The MEMS device 566 is schematically depicted to include a second orifice 572D and a second valve member 574D for controlling gas flow through the second port 534 of the PCB 530B, such as described above for MEMS device 250. In some embodiments, the MEMS device 566 is soldered to the PCB 530B. In some of such embodiments, the solder surrounds the first orifice 572C and the second orifice 572D, and provides a seal between the PCB 530B and the MEMS device 566. The MEMS device 566 is schematically depicted to include a first heater 576C associated with the first orifice 572C and a second heater 576D associated with the second orifice 572D, such as described above for MEMS device 250. In some embodiments, heaters 576C, 576D are omitted, and a heater separate from the MEMS device 566 is coupled to the PCB 530B. The MEMS device 566 is schematically depicted to include a sensor 578B, such as described above for MEMS device 250. In some embodiments, sensor 578B is omitted, and a sensor separate from the MEMS device 566 is coupled to the PCB 530B. Such a sensor may measure any one or more of pressure, temperature, or flow rate. The sensor 578B, the heaters 576C, 576D, and the valve members 574C, 574D of the MEMS device 566, and/or a separate heater (if present) receive electrical power via the PCB 530B.

In some embodiments, the MEMS module 520B includes a diffuser, such as diffuser 528 described above. In some embodiments, the diffuser may be omitted.

In some embodiments, the third unit 586 includes a local controller, such as local controller 429 of FIG. 4A. In such embodiments, it is contemplated that the local controller controls operation of at least one device (such as the MEMS device 566 and/or a separate heater, if present) in the third unit 586. In an example, the local controller is integrated into the MEMS device 566. In another example, the local controller is coupled to the PCB 530B separate from the MEMS device 566.

In some embodiments, each device in the third unit 586 is independently addressable via a corresponding local controller (such as local controller 429), such that the operation of each device in the third unit 586 can be controlled without changing the operating status of any other device of showerhead 500B. In some embodiments, each device in the third unit 586 is assigned to one or more groups of devices, and each group of devices is independently addressable via one or more corresponding local controllers. In such embodiments, the operation of each device within a defined group can be controlled without changing the operating status of any other device of showerhead 500B that is not within the defined group.

In some embodiments, the third unit 586 may be configured to provide independent control of a first gas flow through the first port 532 of the PCB 530B and a second gas flow through the second port 534 of the PCB 530B. For example, an operator can configure the third unit 586 to operate under any one of four modes: (i) flow gas from the first conduit 542 of the manifold 540 only; (ii) flow gas from the second conduit 544 of the manifold 540 only; (iii) flow gas from both the first conduit 542 and the second conduit 544 of the manifold 540; and (iv) do not flow gas from the manifold 540.

In the first mode, first valve member 574C of MEMS device 566 is positioned to at least partially uncover first orifice 572C, and second valve member 574D of MEMS device 566 is positioned to obscure second orifice 572D. In the second mode, first valve member 574C of MEMS device 566 is positioned to obscure first orifice 572C, and second valve member 574D of MEMS device 566 is positioned to at least partially uncover second orifice 572D. In the third mode, first valve member 574C of MEMS device 566 is positioned to at least partially uncover first orifice 572C, and second valve member 574D of MEMS device 566 is positioned to at least partially uncover second orifice 572D. In the fourth mode, first valve member 574C of MEMS device 566 is positioned to obscure first orifice 572C, and second valve member 574D of MEMS device 566 is positioned to obscure second orifice 572D.

It is contemplated that an operator can configure the third unit 586 to switch from one of the first, second, third, or fourth modes to another of the first, second, third, or fourth modes. In an example, an operator may control the third unit 586 to switch between modes in order to adjust a composition of process gases within a zone of a processing volume (120, FIG. 1) of a processing chamber (100, FIG. 1).

The configuration of manifold 540 and PCB 530B depicted in FIG. 5B facilitates expedient switching of gases that are flowed through showerhead 500B. In an example, a first processing operation involves flowing a first gas through first conduit 542, first ducts 546, first ports 532, one or more MEMS devices 560, 562, 566, and through the one or more holes 526, 526A, 526B of the faceplate 510B into a processing volume of a processing chamber. A second processing operation involves flowing a different second gas through first conduit 542, first ducts 546, first ports 532, one or more MEMS devices 560, 562, 566, and through the one or more holes 526, 526A, 526B of the faceplate 510B into the processing volume of the processing chamber. In the event that it is detrimental or undesirable to mix the first gas and the second gas, then the first gas must be purged out of the first conduit 542, the first ducts 546, the first ports 532, the one or more MEMS devices 560, 562, 566, and the processing chamber before flowing the second gas. Because the total volume of the first conduit 442 and the first ducts 446 of the manifold plus the first ports 532 of the PCB 530B is less than the volume of a plenum, such as plenum 116, the quantity of first gas that must be purged and potentially wasted is less for a processing chamber incorporating showerhead 500 B than for a processing chamber that delivers process gases via a plenum. Additionally, the time required for the purging operation is less for a processing chamber incorporating showerhead 500 B than for a processing chamber that delivers process gases via a plenum. Consequently, a processing chamber incorporating showerhead 500 B provides operational efficiencies of time, gas wastage, throughput, and cost over a processing chamber that delivers process gases via a plenum.

The configuration of manifold 540 and PCB 530B depicted in FIG. 5B facilitates expedient simultaneous delivery of gases that are flowed through showerhead 500B. In an example, a first gas is flowed through first conduit 542, first ducts 546, first ports 532, and one or more MEMS devices 562, 566. A second gas is flowed through second conduit 544, second ducts 548, second ports 534, and one or more MEMS devices 564, 566. The first and second gases are mixed in the MEMS modules 520A, 520B of the second 584 and third 586 units, respectively, before passing through the one or more holes 526A, 526B, respectively, of the faceplate 510B. The MEMS devices 562, 564, 566 facilitate localized adjustments to the ratio of first and second gases within each unit 584, 586. Furthermore, the MEMS devices 562, 564, 566 facilitate localized adjustments to the combined flowrate of first and second gases within each unit 584, 586.

Consequently, the flowrates and relative quantities of the first and second gas within different regions of the processing volume of a processing chamber can be tailored. In some embodiments, the flowrates and relative quantities of the first and second gas are adjusted towards being uniform across the processing volume. In some embodiments, the flowrates and relative quantities of the first and second gas are adjusted to provide a greater flow of gas in a first region of the processing volume and a lesser flow of gas in a second region of the processing volume. In some embodiments, the flowrates and relative quantities of the first and second gas are adjusted to provide a greater proportion of the first gas than the second gas in a first region of the processing volume, and a greater proportion of the second gas than the first gas in a second region of the processing volume.

FIGS. 6A-6G are schematic cross-sectional side views of different configurations of MEMS modules. In some embodiments, it is contemplated that showerhead 500A and showerhead 500B may include MEMS modules of the same configuration. Additionally, or alternatively, it is contemplated that showerhead 500A and showerhead 500B may include MEMS modules of different configurations.

Figure 6A:
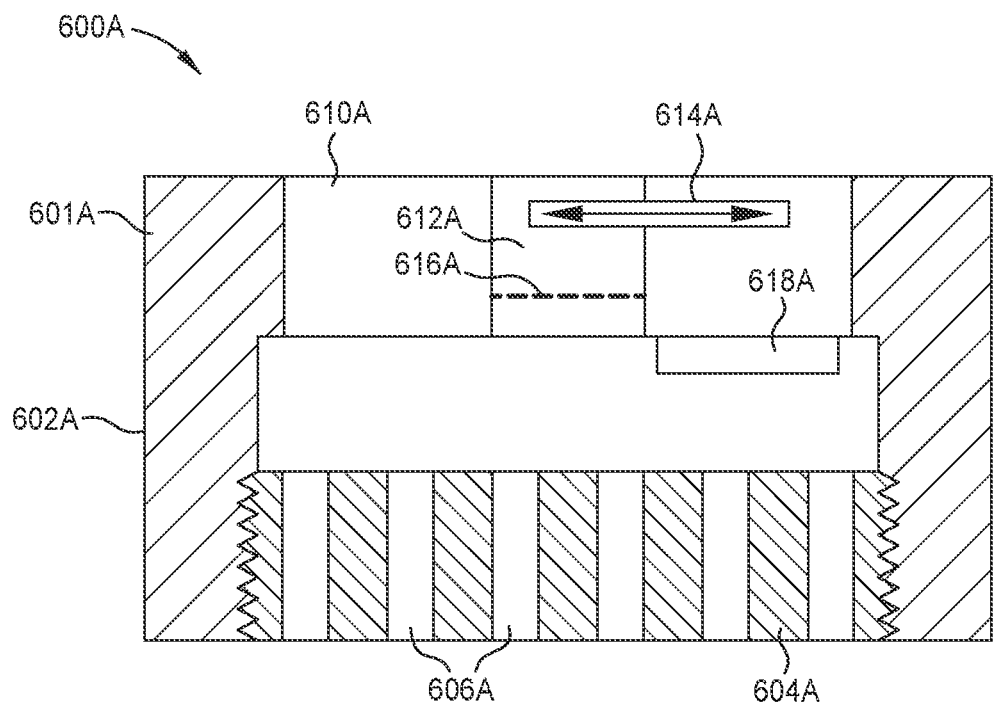
FIGS. 6A-6G are schematic cross-sectional side views of configurations of MEMS modules.

FIG. 6A illustrates MEMS module 600A. It is contemplated that MEMS module 600A may be used as any of MEMS modules 520, 520A, or 520B. MEMS module 600A is shown as including MEMS device 610A. It is contemplated that MEMS device 610A may be configured similarly to MEMS device 200 or MEMS device 250. MEMS device 610A is schematically depicted to include an orifice 612A, a valve member 614A, a heater 616A at the orifice 612A, and a sensor 618A, such as described above for MEMS device 200. In some embodiments, it is contemplated that MEMS module 600A may alternatively include any variant of any MEMS device described above. Additionally, it is contemplated that MEMS module 600A may contain more than one MEMS device.

MEMS module 600A includes a body 601A with sidewalls 602A. In some embodiments, the body 601A is integrated with MEMS device 610A. In some embodiments, the body 601A may be attached to MEMS device 610A. In another embodiment, the body 601A is configured to be attached to a PCB separately from MEMS device 610A. The sidewalls 602A extend below MEMS device 610A to a base 604A. One or more holes 606A in the base 604A facilitate gases to flow through the MEMS device 610A. The base 604A is configured as an insert that is coupled to the sidewalls 602A. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602A by a screw thread. In some embodiments, a diffuser, such as diffuser 470, is disposed above the one or more holes 606A.

In some embodiments, MEMS module 600A includes a local controller, such as local controller 429 of FIG. 4A. In such embodiments, it is contemplated that the local controller controls operation of MEMS device 610A. In an example, the local controller is integrated into the MEMS device 610A. In another example, the local controller is coupled to a PCB separately from MEMS device 610A.

Figure 6B:
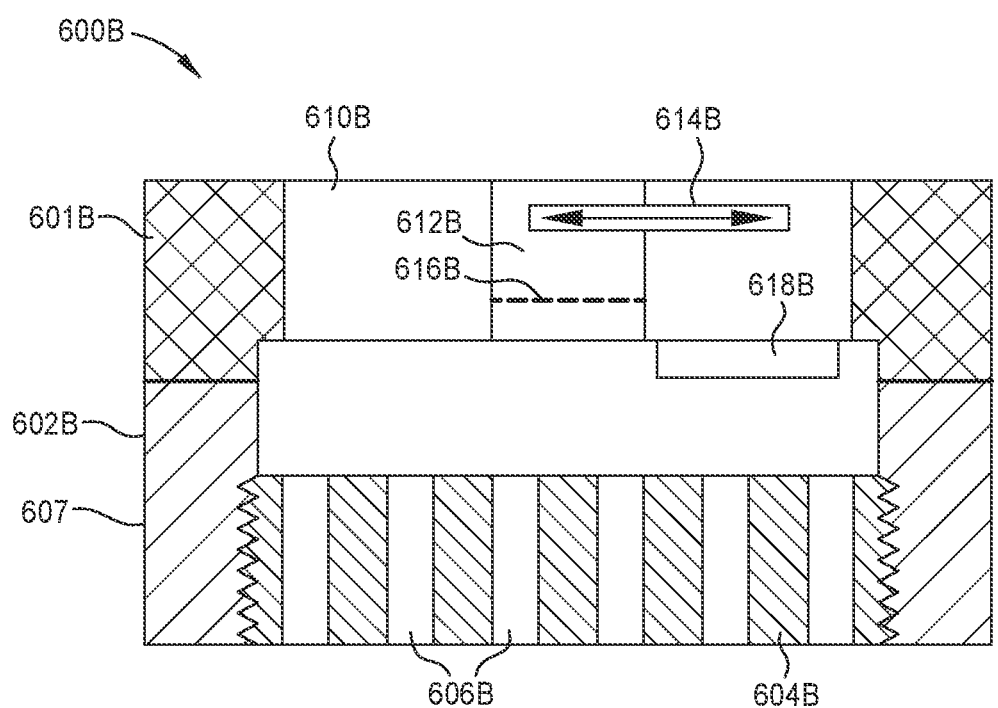

FIG. 6B illustrates MEMS module 600B. It is contemplated that MEMS module 600B may be used as any of MEMS modules 520, 520A, or 520B. MEMS module 600B is shown as including MEMS device 610B. It is contemplated that MEMS device 610B may be configured similarly to MEMS device 200 or MEMS device 250. MEMS device 610B is schematically depicted to include an orifice 612B, a valve member 614B, a heater 616B at the orifice 612B, and a sensor 618B, such as described above for MEMS device 200. In some embodiments, it is contemplated that MEMS module 600B may alternatively include any variant of any MEMS device described above. Additionally, it is contemplated that MEMS module 600B may contain more than one MEMS device.

MEMS module 600B includes a body 601B. In some embodiments, the body 601B is integrated with MEMS device 610B. In some embodiments, the body 601B may be attached to MEMS device 610B. In another embodiment, the body 601B is configured to be attached to a PCB separately from MEMS device 610B. An insert holder 607 is attached to the body 601B, such as by a weld or an adhesive bond. The insert holder 607 includes sidewalls 602B extending below MEMS device 610B to a base 604B. One or more holes 606B in the base 604B facilitate gases to flow through the MEMS device 610B. The base 604B is configured as an insert that is coupled to the sidewalls 602B. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602B by a screw thread. In some embodiments, a diffuser, such as diffuser 470, is disposed above the one or more holes 606B.

In some embodiments, MEMS module 600B includes a local controller, such as local controller 429 of FIG. 4A. In such embodiments, it is contemplated that the local controller controls operation of MEMS device 610B. In an example, the local controller is integrated into the MEMS device 610B. In another example, the local controller is coupled to a PCB separately from MEMS device 610B.

Figure 6C:
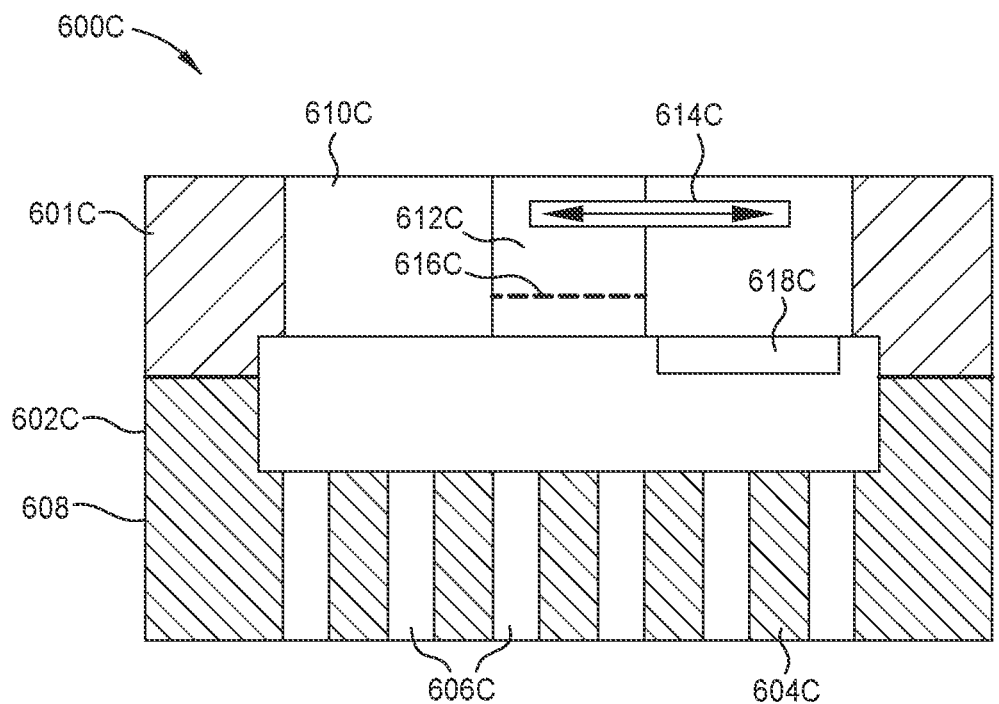

FIG. 6C illustrates MEMS module 600C. It is contemplated that MEMS module 600C may be used as any of MEMS modules 520, 520A, or 520B. MEMS module 600C is shown as including MEMS device 610C. It is contemplated that MEMS device 610C may be configured similarly to MEMS device 200 or MEMS device 250. MEMS device 610C is schematically depicted to include an orifice 612C, a valve member 614C, a heater 616C at the orifice 612C, and a sensor 618C, such as described above for MEMS device 200. In some embodiments, it is contemplated that MEMS module 600C may alternatively include any variant of any MEMS device described above. Additionally, it is contemplated that MEMS module 600C may contain more than one MEMS device.

MEMS module 600C includes a body 601C. In some embodiments, the body 601C is integrated with MEMS device 610C. In some embodiments, the body 601C may be attached to MEMS device 610C. In another embodiment, the body 601C is configured to be attached to a PCB separately from MEMS device 610C. A base unit 608 is attached to the body 601C, such as by a weld or an adhesive bond. The base unit 608 includes sidewalls 602C extending below MEMS device 610C to a base 604C. One or more holes 606C in the base 604C facilitate gases to flow through the MEMS device 610C. The base 604B is affixed to, or is integral with, the sidewalls 602C. In some embodiments, a diffuser, such as diffuser 470, is disposed above the one or more holes 606C.

In some embodiments, MEMS module 600C includes a local controller, such as local controller 429 of FIG. 4A. In such embodiments, it is contemplated that the local controller controls operation of MEMS device 610C. In an example, the local controller is integrated into the MEMS device 610C. In another example, the local controller is coupled to a PCB separately from MEMS device 610C.

Figure 6D:
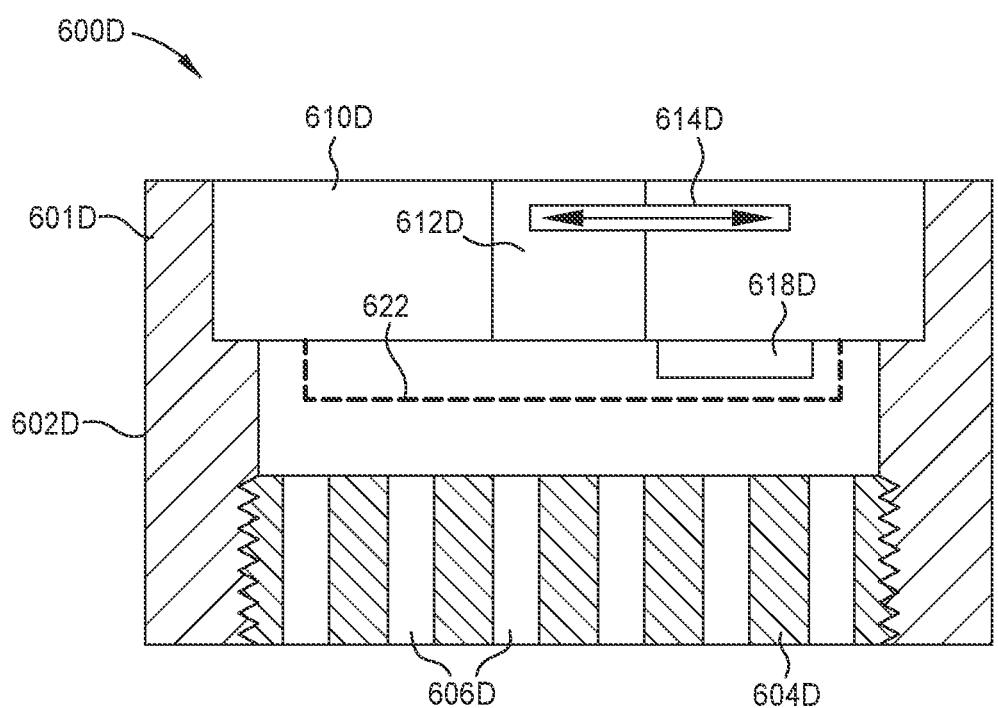

FIG. 6D illustrates MEMS module 600D. It is contemplated that MEMS module 600D may be used as any of MEMS modules 520, 520A, or 520B. MEMS module 600D is shown as including MEMS device 610D. It is contemplated that MEMS device 610D may be configured similarly to MEMS device 200 or MEMS device 250. MEMS device 610D is schematically depicted to include an orifice 612D, a valve member 614D, and a sensor 618D, such as described above for MEMS device 200. A heater 622 is attached to MEMS device 610D, and extends below MEMS device 610D. In some embodiments, the heater 622 includes a mesh, such as a sintered mesh. In some embodiments, the heater 622 also serves as a diffuser or a filter. In some embodiments, it is contemplated that MEMS module 600D may alternatively include any variant of any MEMS device described above. Additionally, it is contemplated that MEMS module 600D may contain more than one MEMS device.

MEMS module 600D includes a body 601D with sidewalls 602D. In some embodiments, the body 601D is integrated with MEMS device 610D. In some embodiments, the body 601D may be attached to MEMS device 610D. In another embodiment, the body 601D is configured to be attached to a PCB separately from MEMS device 610D. The sidewalls 602D extend below MEMS device 610D to a base 604D. One or more holes 606D in the base 604D facilitate gases to flow through the MEMS device 610D. The base 604D is configured as an insert that is coupled to the sidewalls 602D. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602D by a screw thread. In some embodiments, a diffuser, such as diffuser 470, is disposed above the one or more holes 606D.

In some embodiments, MEMS module 600D includes a local controller, such as local controller 429 of FIG. 4A. In such embodiments, it is contemplated that the local controller controls operation of MEMS device 610D. In an example, the local controller is integrated into the MEMS device 610D. In another example, the local controller is coupled to a PCB separately from MEMS device 610D.

Figure 6E:
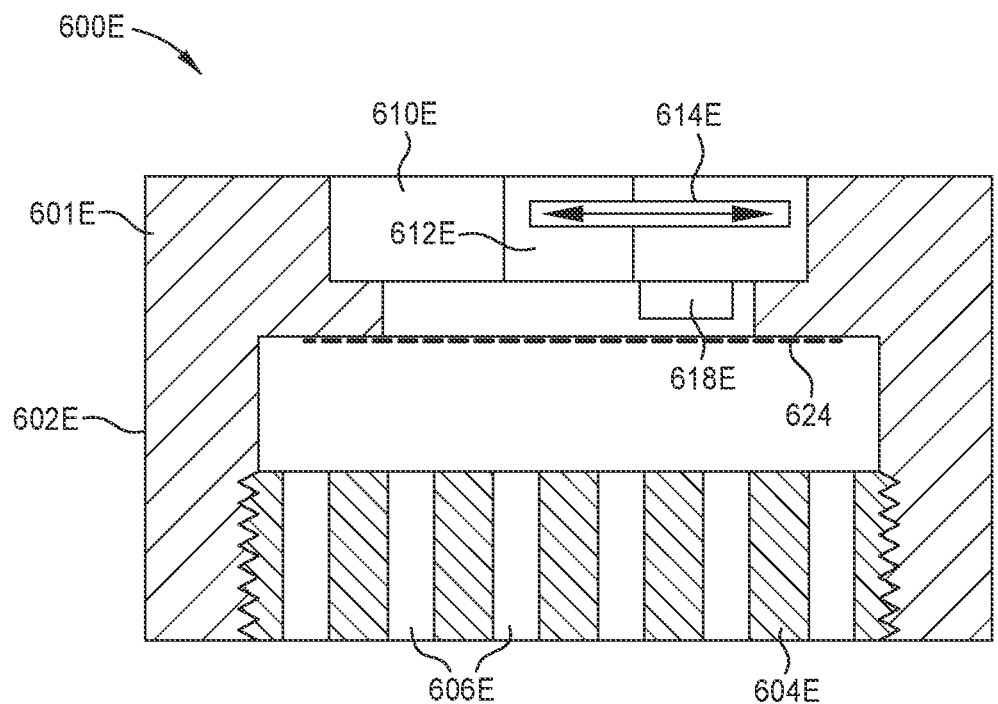

FIG. 6E illustrates MEMS module 600E. It is contemplated that MEMS module 600E may be used as any of MEMS modules 520, 520A, or 520B. MEMS module 600E is shown as including MEMS device 610E. It is contemplated that MEMS device 610E may be configured similarly to MEMS device 200 or MEMS device 250. MEMS device 610E is schematically depicted to include an orifice 612E, a valve member 614E, and a sensor 618E, such as described above for MEMS device 200. In some embodiments, it is contemplated that MEMS module 600E may alternatively include any variant of any MEMS device described above. Additionally, it is contemplated that MEMS module 600E may contain more than one MEMS device.

MEMS module 600E includes a body 601E with sidewalls 602E. In some embodiments, the body 601E is integrated with MEMS device 610E. In some embodiments, the body 601E may be attached to MEMS device 610E. In another embodiment, the body 601E is configured to be attached to a PCB separately from MEMS device 610E. The sidewalls 602E extend below MEMS device 610E to a base 604E. One or more holes 606E in the base 604E facilitate gases to flow through the MEMS device 610E. The base 604E is configured as an insert that is coupled to the sidewalls 602E. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602E by a screw thread. In some embodiments, a diffuser, such as diffuser 470, is disposed above the one or more holes 606E.

MEMS module 600E includes a heater 624 that is separate from MEMS device 610E. Heater 624 is attached to body 601E. It is contemplated that electrical connections between the heater 624 and a PCB may be facilitated by wiring through the body 601E and/or through MEMS device 610E. As illustrated, it is contemplated that heater 624 may be located below MEMS device 610E. In some embodiments, the heater 624 includes a mesh, such as a sintered mesh. In some embodiments, the heater 624 also serves as a diffuser or a filter.

In some embodiments, MEMS module 600E includes a local controller, such as local controller 429 of FIG. 4A. In such embodiments, it is contemplated that the local controller controls operation of MEMS device 610E. In an example, the local controller is integrated into the MEMS device 610E. In another example, the local controller is coupled to a PCB separately from MEMS device 610E.

Figure 6F:
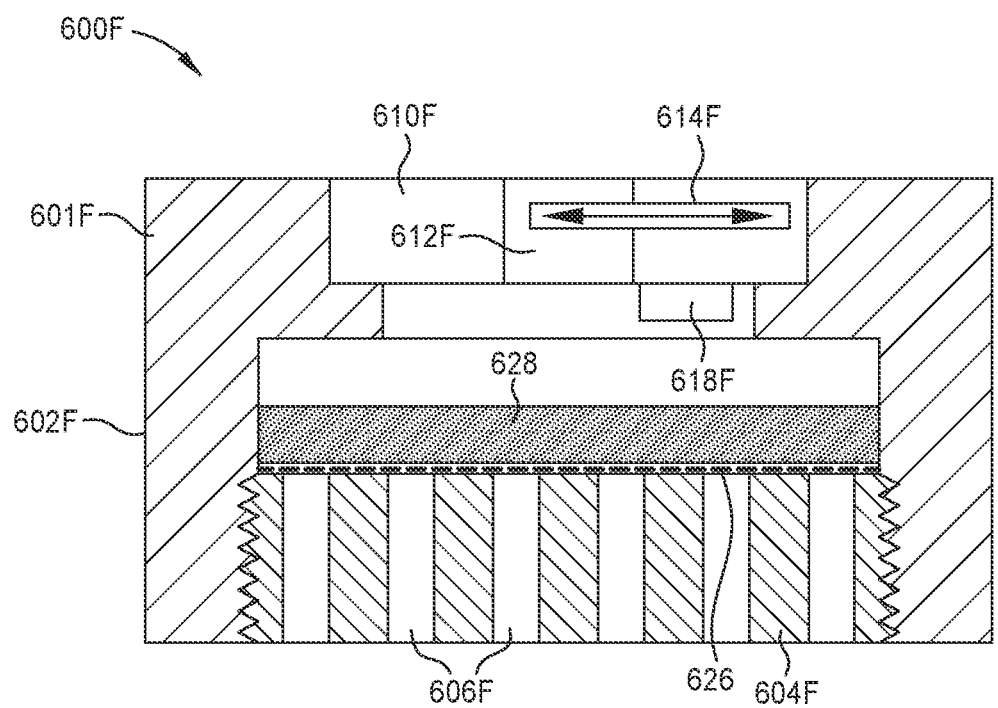

FIG. 6F illustrates MEMS module 600F. It is contemplated that MEMS module 600F may be used as any of MEMS modules 520, 520A, or 520B. MEMS module 600F is shown as including MEMS device 610F. It is contemplated that MEMS device 610F may be configured similarly to MEMS device 200 or MEMS device 250. MEMS device 610F is schematically depicted to include an orifice 612F, a valve member 614F, and a sensor 618F, such as described above for MEMS device 200. In some embodiments, it is contemplated that MEMS module 600F may alternatively include any variant of any MEMS device described above. Additionally, it is contemplated that MEMS module 600F may contain more than one MEMS device.

MEMS module 600F includes a body 601F with sidewalls 602F. In some embodiments, the body 601F is integrated with MEMS device 610F. In some embodiments, the body 601F may be attached to MEMS device 610F. In another embodiment, the body 601F is configured to be attached to a PCB separately from MEMS device 610F. The sidewalls 602F extend below MEMS device 610F to a base 604F. One or more holes 606F in the base 604F facilitate gases to flow through the MEMS device 610F. The base 604F is configured as an insert that is coupled to the sidewalls 602F. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602F by a screw thread.

MEMS module 600F includes a heater 626 that is separate from MEMS device 610F. Heater 626 is attached to body 601F. It is contemplated that electrical connections between the heater 626 and a PCB may be facilitated by wiring through the body 601F and/or through MEMS device 610F. In some embodiments, the heater 626 includes a mesh, such as a sintered mesh. In some embodiments, the heater 626 also serves as a diffuser or a filter.

As illustrated, it is contemplated that heater 626 may be located below MEMS device 610F at, or close to, the base 604F. As illustrated, in some embodiments it is contemplated that a diffuser 628, such as diffuser 470, may be located between the heater 626 and the MEMS device 610F.

In some embodiments, MEMS module 600F includes a local controller, such as local controller 429 of FIG. 4A. In such embodiments, it is contemplated that the local controller controls operation of MEMS device 610F. In an example, the local controller is integrated into the MEMS device 610F. In another example, the local controller is coupled to a PCB separately from MEMS device 610F.

Figure 6G:
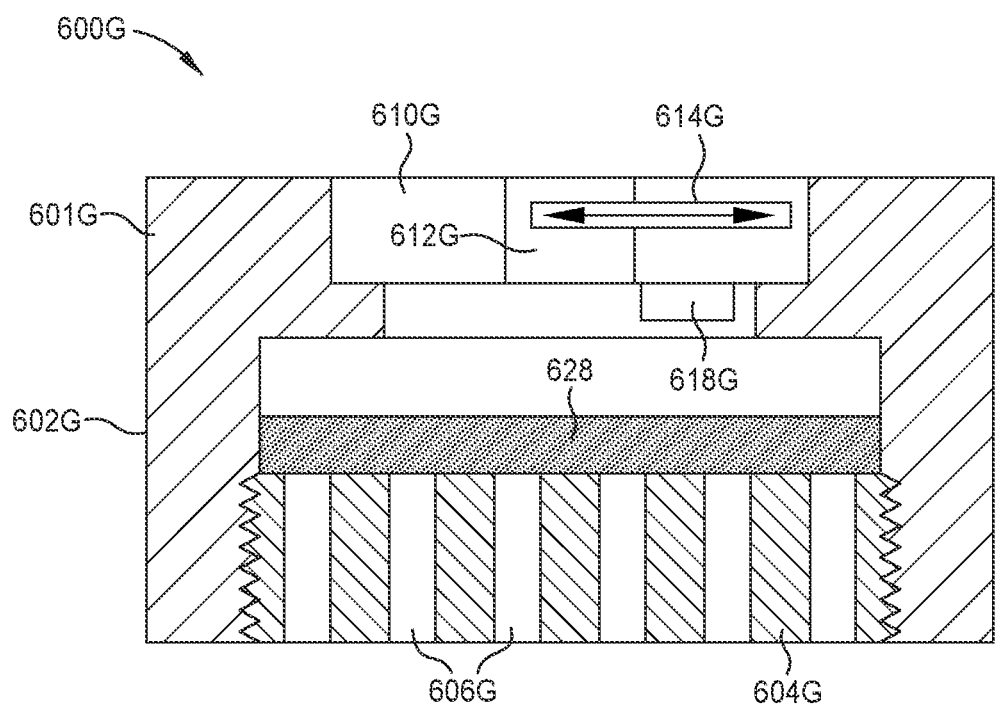

FIG. 6G illustrates MEMS module 600G. It is contemplated that MEMS module 600G may be used as any of MEMS modules 520, 520A, or 520B. MEMS module 600G is shown as including MEMS device 610G. It is contemplated that MEMS device 610G may be configured similarly to MEMS device 200 or MEMS device 250. MEMS device 610G is schematically depicted to include an orifice 612G, a valve member 614G, and a sensor 618G, such as described above for MEMS device 200. In some embodiments, it is contemplated that MEMS module 600G may alternatively include any variant of any MEMS device described above. Additionally, it is contemplated that MEMS module 600G may contain more than one MEMS device.

MEMS module 600G includes a body 601G with sidewalls 602G. In some embodiments, the body 601G is integrated with MEMS device 610G. In some embodiments, the body 601G may be attached to MEMS device 610G. In another embodiment, the body 601G is configured to be attached to a PCB separately from MEMS device 610G. The sidewalls 602G extend below MEMS device 610G to a base 604G. One or more holes 606G in the base 604G facilitate gases to flow through the MEMS device 610G. The base 604G is configured as an insert that is coupled to the sidewalls 602G. In some embodiments, the insert is removable to facilitate, for example, replacement with an alternative insert having different hole sizes, a different number of holes, or a different pattern of holes. In an example, the insert is removed to facilitate cleaning and/or refurbishment of the showerhead. In an example, the insert is coupled to the sidewalls 602G by a screw thread. As illustrated, in some embodiments, a diffuser 628, such as diffuser 470, is disposed above the one or more holes 606G.

It is contemplated that at least the base 604G may serve as a heating element. As an example, the base may be manufactured from graphite, such as in the form of IFS-2B. In some embodiments, the sidewalls 602G are manufactured from a material similar to that of the base 604G. In some embodiments, the body 601G is manufactured from a material similar to that of the base 604G. It is contemplated that any part of the body 601G, sidewalls 602G, or base 604G that is not manufactured to serve as a heating element may be manufactured out of a corrosion-resistant material, such as a ceramic or a metal such as titanium.

In some embodiments, MEMS module 600G includes a local controller, such as local controller 429 of FIG. 4A. In such embodiments, it is contemplated that the local controller controls operation of MEMS device 610G. In an example, the local controller is integrated into the MEMS device 610G. In another example, the local controller is coupled to a PCB separately from MEMS device 610G.

To inhibit corrosion and/or reduce a probability that a valve member of a MEMS device may stick in position and become inoperable, it is contemplated that surfaces of each MEMS device 610A-610G, and/or local controller (if present), and/or heater 622, 624, 626, and/or diffuser (if present) may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

To inhibit corrosion, it is contemplated that each MEMS module 600A-600F may be manufactured out of a corrosion-resistant material, such as a ceramic or a metal such as titanium. Additionally, or alternatively, surfaces of each MEMS module 600A-600F and 600G may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

FIG. 7 is a schematic plan view of a faceplate 700 of a showerhead. It is contemplated that faceplate 700 may represent any faceplate of the present disclosure, such as any of faceplates 310, 410, 510A, 510B in a corresponding showerhead 300, 400A, 400B, 500A, 500B that is used as showerhead 112 of processing chamber 100. Zones 710 are delineated on faceplate 700, each zone 710 includes one or more openings 712 through the faceplate 700. In operation, process gas flow through the one or more openings 712 of a specific zone 710 is controlled by one or more MEMS devices associated with the specific zone 710. In operation, one or more devices, such as MEMS devices and/or heaters, are associated with each zone 710, and are controlled independently and/or in groups, as described above. In an example, the operation of each MEMS device or heater can be controlled without changing the operating status of another MEMS device or heater associated with faceplate 700. It is contemplated that the number, size, and distribution of zones 710 may be configured according to the type of process to be conducted in processing chamber 100 and/or the specific process gas(es) to be employed.

It is contemplated that any of PCB 330, 430, 530A, 530B may be made from a ceramic material with metal conductors embedded therein. In some embodiments, it is contemplated that PCBs 530A and 530B may include a provision for coupling to one or more support members. In an example, the one or more support members facilitate PCBs 530A and 530B spanning a processing volume in a processing chamber and bearing the weight of components, such as MEMS modules 520, 520A, 520B, that are suspended from PCBs 530A and 530B. In a further example, the manifold 540 acts as a support member for PCB 530B.

It is contemplated that manifold 440 or 540 may be made from a ceramic material. In some embodiments, it is contemplated that manifold 440 or 540 may include a provision for coupling to one or more support members. In an example, the one or more support members facilitate manifold 440 or 540 spanning a processing volume in a processing chamber and bearing the weight of components, such as PCB 430 or 530B, that are suspended from manifold 440 or 540. In a further example, the PCB 530B acts as a support member for manifold 540.

It is contemplated that any of master controllers 350, 450, 550 includes a central processing unit (CPU), a memory containing instructions, and support circuits for the CPU. The master controller 350, 450, 550 is of any form of a general-purpose computer processor that is used in an industrial setting for controlling various chambers and equipment and/or sub-processors thereon or therein.

The memory, or non-transitory computer readable medium, is one or more of a readily available memory such as random access memory (RAM), read only memory (ROM), floppy disk, hard disk, flash drive, or any other form of digital storage, local or remote. The support circuits are coupled to the CPU for supporting the CPU (a processor). The support circuits include cache, power supplies, clock circuits, input/output circuitry and subsystems, and the like. Operations and operating parameters are stored in the memory as a software routine that is executed or invoked to turn the master controller 350, 450, 550 into a specific purpose controller to control the operations of any of showerhead 300, 400A, 400B, 500A, 500B. The master controller 350, 450, 550 is configured to conduct any of the operations described herein. The instructions stored on the memory, when executed, cause one or more of the operations described herein to be conducted.

In some embodiments, data from any of sensors 236, 328, 578, 578A, 578B, 618A, 618B, 618C, 618D, 618E, 618F, 618G and/or any sensor associated with any of showerhead 300, 400A, 400B, 500A, 500B may be used to provide feedback to a controller, such as any of master controller 350, 450, 550. In some embodiments, data of electrical current through any of heaters 326, 424, 576, 576A, 576B, 576C, 576D, 616A, 616B, 616C, 622, 624, 626, and/or any heater associated with any of showerhead 300, 400A, 400B, 500A, 500B may be used to provide feedback to a controller, such as any of master controller 350, 450, 550. For example, the data may include pressure data and/or temperature data.

The controller, such as any of master controller 350, 450, 550 uses the data so provided as an input to process commands addressed to individual MEMS device(s) and/or group(s) of MEMS devices. In some of such embodiments, the commands prompt the individual MEMS device(s) and/or group(s) of MEMS devices to adjust a flowrate of a gas through the individual MEMS device(s) and/or group(s) of MEMS devices. In an example, such adjustments provide control of flow distribution of one or more gases through any of showerhead 300, 400A, 400B, 500A, 500B. In some of such embodiments, the commands prompt the individual MEMS device(s) and/or group(s) of MEMS devices to adjust a temperature of a gas flowing through the individual MEMS device(s) and/or group(s) of MEMS devices. In an example, such adjustments provide control of temperature distribution of one or more gases through any of showerhead 300, 400A, 400B, 500A, 500B.

The instructions in the memory of the master controller 350, 450, 550 can include one or more machine learning/artificial intelligence algorithms that can be executed in addition to the operations described herein. As an example, a machine learning/artificial intelligence algorithm executed by the master controller 350, 450, 550 can optimize and alter operational parameters based on one or more sensor measurements taken by the one or more sensors 236, 328, 578, 578A, 578B, 618A-618G. The operational parameters can include, for example, pressure, temperature, gas flow rate, valve member position, and heater status.

The one or more machine learning/artificial intelligence algorithms can account for variations in gas flow rate, gas ratios, temperature, and pressure across any of the showerheads described herein. In some embodiments, the one or more machine learning/artificial intelligence algorithms can measure any of the above parameters to determine whether an appropriate quantity of a process gas at an appropriate pressure and an appropriate temperature is being delivered to the appropriate regions of a processing volume according to a prescribed operation. In some embodiments, the one or more machine learning/artificial intelligence algorithms can prompt the master controller 350, 450, 550 to initiate corrective action in order to adjust the quantity, pressure, or temperature of a process gas being delivered to a prescribed region of a processing volume.

The operational flexibilities described above facilitated by showerheads of the present disclosure are not provided by conventional showerheads. Conventional showerheads typically are configured for achieving an optimal distribution of a specific process gas by having a given number of openings of particular sizes arranged in a specific pattern. However, the number, sizing, and arrangement of openings that provides for an optimal distribution of a one process gas do not necessarily provide for an optimal distribution of a different process gas. In contrast, showerheads of the present disclosure provide for the relative flow rate of any process gas through an opening, or a cluster of openings, to be tailored provide for an optimal distribution of any process gas.

The operational flexibilities facilitated by showerheads of the present disclosure provide time and cost efficiencies compared to conventional operations. For example, some conventional processing sequences involve performing a first operation on a substrate with a first process gas in a first processing chamber, then transferring the substrate to a second processing chamber, then performing a second operation on the substrate with a second, different, process gas. In contrast, processing chambers incorporating showerheads of the present disclosure may be used to perform both the first operation with the first process gas and then the second operation with the second process gas. Thus, the need for the second processing chamber is alleviated, as is the time taken to transfer the substrate between the processing chambers.

In another example, some conventional processing sequences involve performing a first operation on a substrate with a first process gas in a first processing chamber including a first conventional showerhead, then transferring the substrate to a second processing chamber that includes a second conventional showerhead, then performing a second operation on the substrate in the processing chamber with a second, different, process gas. In contrast, processing chambers incorporating showerheads of the present disclosure may be used to perform both the first operation with the first process gas and then the second operation with the second process gas using the same showerhead in the same processing chamber. Thus, the need for transferring the substrate between processing chambers is alleviated, as is the time taken to transfer the substrate.

Furthermore, the operational flexibilities facilitated by showerheads of the present disclosure provide efficiencies in inventory management compared to conventional operations. The use of showerheads of the present disclosure reduces or eliminates the need to stock different showerheads that are configured for use with different process gases for different process operations.

It is contemplated that elements and features of any one disclosed embodiment may be beneficially incorporated in one or more other embodiments. While the foregoing is directed to embodiments of the present disclosure, other and further embodiments of the disclosure may be devised without departing from the basic scope thereof, and the scope thereof is determined by the claims that follow.

What is claimed is:

1. A showerhead for a processing chamber, the showerhead comprising:
 a printed circuit board including a plurality of ports therethrough; and
 a faceplate including:
  a plurality of MEMS modules coupled to the printed circuit board, each MEMS module including:
   a body with sidewalls extending to a base, the base including a plurality of holes; and
   a MEMS device disposed in the body, the MEMS device including an orifice and a corresponding valve member operable to control fluid flow from at least one of the plurality of ports to the plurality of holes.

2. The showerhead of claim 1, wherein
 the valve member is movable between first and second positions to regulate the fluid flow through the orifice.

3. The showerhead of claim 2, wherein each MEMS module includes a heater configured to heat a fluid conveyed through the orifice.

4. The showerhead of claim 2, wherein the valve member blocks fluid flow through the orifice when in the first position.

5. The showerhead of claim 1, further comprising a local controller coupled to the printed circuit board, the local controller configured to control operation of a corresponding MEMS device of the plurality of MEMS modules.

6. The showerhead of claim 1, further comprising a manifold coupled to the printed circuit board, the manifold including a first conduit and a plurality of first ducts, each first duct associated with a corresponding first port of the plurality of ports of the printed circuit board.

7. The showerhead of claim 6, wherein the manifold includes a second conduit and a plurality of second ducts, each second duct associated with a corresponding second port of the plurality of ports of the printed circuit board.

8. The showerhead of claim 7, wherein:
 the MEMS device includes a first MEMS device and a second MEMS device;
 the first MEMS device is associated with a corresponding first port of the plurality of ports; and
 the second MEMS device is associated with a corresponding second port of the plurality of ports.

9. The showerhead of claim 1, wherein each MEMS module of the plurality of MEMS modules is suspended from the printed circuit board.

10. The showerhead of claim 1, wherein each MEMS device is suspended from the printed circuit board.

11. The showerhead of claim 1, wherein at least one MEMS module of the plurality of MEMS modules includes a diffuser disposed above the plurality of holes.

12. A showerhead for a processing chamber, the showerhead comprising:
 a printed circuit board including a plurality of ports therethrough; and
 a faceplate including:
  a plurality of MEMS modules suspended from the printed circuit board, each MEMS module including:
   a body with sidewalls extending to a base, the base including a plurality of holes; and
   a MEMS device disposed in the body and spaced from the plurality of holes, the MEMS device including an orifice and a valve member operable to control fluid flow from at least one of the plurality of ports, through the orifice, and to the plurality of holes.

13. The showerhead of claim 12, wherein:
 the valve member is movable between first and second positions to regulate fluid flow through the orifice; and
 the valve member blocks fluid flow through the orifice when in the first position.

14. The showerhead of claim 12, wherein at least one MEMS module of the plurality of MEMS modules includes a heater configured to heat a fluid conveyed through the orifice.

15. The showerhead of claim 12, wherein at least one MEMS module of the plurality of MEMS modules includes a diffuser disposed above the plurality of holes.

16. The showerhead of claim 12, further comprising a local controller coupled to the printed circuit board, the local controller configured to control operation of a corresponding MEMS device of the plurality of MEMS modules.

17. The showerhead of claim 12, further comprising a manifold coupled to the printed circuit board, the manifold including a first conduit and a plurality of first ducts, each first duct associated with a corresponding first port of the plurality of ports of the printed circuit board.

18. The showerhead of claim 17, wherein the manifold includes a second conduit and a plurality of second ducts, each second duct associated with a corresponding second port of the plurality of ports of the printed circuit board.

19. The showerhead of claim 18, wherein:
 the MEMS device includes a first MEMS device and a second MEMS device;
 the first MEMS device is associated with a corresponding first port of the plurality of ports; and
 the second MEMS device is associated with a corresponding second port of the plurality of ports.

20. A processing chamber comprising:
 a chamber body;
 a printed circuit board including a plurality of ports therethrough; and a showerhead disposed in the chamber body, the showerhead comprising:
  a faceplate including:
    a plurality of MEMS modules coupled to the printed circuit board, each MEMS module including:
      a body with sidewalls extending to a base, the base including a plurality of holes; and
      a MEMS device disposed in the body, the MEMS device including an orifice and a corresponding valve member operable to control fluid flow from at least one of the plurality of ports to the plurality of holes and
  a controller coupled to the printed circuit board, and configured to control operations at least one MEMS device of the plurality of MEMS devices independently of operations of other MEMS devices of the plurality of MEMS devices.

\* \* \* \* \*